United States Patent
Goddard et al.

(10) Patent No.: US 10,734,237 B2
(45) Date of Patent: Aug. 4, 2020

(54) SPECTRALLY AND TEMPORALLY ENGINEERED PROCESSING USING PHOTOELECTROCHEMISTRY

(71) Applicant: The Board of Trustees of the University of Illinois, Urbana, IL (US)

(72) Inventors: Lynford Goddard, Champaign, IL (US); Kaiyuan Wang, Atlanta, GA (US); Chris Edwards, Chandler, AZ (US); Lonna Edwards, Louisville, KY (US); Xin Yu, Urbana, IL (US); Gang Logan Liu, Champaign, IL (US); Samuel Washington, Urbana, IL (US); Shailendra Srivastava, Urbana, IL (US); Terry Koker, Gibson City, IL (US); Julianne Lee, Savoy, IL (US); Catherine Britt Carlson, Saint Joseph, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/986,304

(22) Filed: May 22, 2018

(65) Prior Publication Data

US 2018/0301344 A1    Oct. 18, 2018

Related U.S. Application Data

(63) Continuation of application No. 14/988,895, filed on Jan. 6, 2016, now Pat. No. 10,115,599, which is a
(Continued)

(51) Int. Cl.
*H01L 21/306* (2006.01)
*H01L 31/0232* (2014.01)
(Continued)

(52) U.S. Cl.
CPC .......... *H01L 21/30604* (2013.01); *C25F 3/12* (2013.01); *C25F 3/14* (2013.01);
(Continued)

(58) Field of Classification Search
CPC .......... H01L 21/30604; H01L 21/3063; H01L 21/76886; H01L 22/12; H01L 21/30617;
(Continued)

(56) References Cited

U.S. PATENT DOCUMENTS

| 4,369,099 A | 1/1983 | Kohl et al. |
| 4,482,442 A | 11/1984 | Kohl et al. |

(Continued)

OTHER PUBLICATIONS

Arabi et al., "An Active-Passive Monolithic Integration Platform with Low Loss Passive Section," IEEE Photonics Conference, Bellevue WA, paper MF3.2, pp. 111-112, Sep. 2013.
(Continued)

*Primary Examiner* — Anita K Alanko
(74) *Attorney, Agent, or Firm* — Sunstein LLP

(57) ABSTRACT

Methods and apparatus for subtractively fabricating three-dimensional structures relative to a surface of a substrate and for additively depositing metal and dopant atoms onto the surface and for diffusing them into the bulk. A chemical solution is applied to the surface of the semiconductor substrate, and a spatial pattern of electron-hole pairs is generated by projecting a spatial pattern of illumination characterized by a specified intensity, wavelength and duration at each pixel of a plurality of pixels on the surface. Charge carriers are driven away from the surface of the semiconductor on a timescale short compared to the carrier recombination lifetime. Such methods are applied to creating a spatially varying doping profile in the semiconductor substrate, a photonic integrated circuit and an integrated photonic microfluidic circuit.

23 Claims, 15 Drawing Sheets

Related U.S. Application Data continuation-in-part of application No. 13/630,286, filed on Sep. 28, 2012, now Pat. No. 9,255,791.

(51) Int. Cl.

| | |
|---|---|
| *H01L 31/0236* | (2006.01) |
| *H01L 21/768* | (2006.01) |
| *H01L 21/3063* | (2006.01) |
| *C25F 3/14* | (2006.01) |
| *C25F 3/12* | (2006.01) |
| *G01B 11/24* | (2006.01) |
| *H01L 21/66* | (2006.01) |
| *B81C 1/00* | (2006.01) |

(52) U.S. Cl.
CPC ...... *G01B 11/2441* (2013.01); *H01L 21/3063* (2013.01); *H01L 21/76886* (2013.01); *H01L 22/12* (2013.01); *H01L 31/02327* (2013.01); *H01L 31/02363* (2013.01); *B81C 1/00103* (2013.01); *B81C 1/00111* (2013.01); *B81C 1/00119* (2013.01); *B81C 1/00214* (2013.01); *B81C 1/00484* (2013.01); *B81C 1/00539* (2013.01); *B81C 1/00595* (2013.01); *B81C 2201/0114* (2013.01); *B81C 2201/0139* (2013.01); *B81C 2201/0157* (2013.01); *H01L 21/30617* (2013.01)

(58) Field of Classification Search
CPC .......... H01L 1122/12; C25F 3/12; C25F 3/14; G01B 11/2441; B81C 1/00103; B81C 1/00111; B81C 1/00119; B81C 1/00214; B81C 1/00484; B81C 1/00539; B81C 1/00595; B81C 2201/0114; B81C 2201/0139; B81C 2201/0157
See application file for complete search history.

(56) References Cited

U.S. PATENT DOCUMENTS

| | | | |
|---|---|---|---|
| 4,482,443 | A | 11/1984 | Bacon et al. |
| 4,608,138 | A | 8/1986 | Kobayashi |
| 5,336,379 | A | 8/1994 | Chung et al. |
| 5,378,330 | A | 1/1995 | Li et al. |
| 5,824,206 | A | 10/1998 | Quinlan |
| 5,976,703 | A * | 11/1999 | Nakata .............. C08L 83/14 257/E23.077 |
| 6,992,360 | B2 | 1/2006 | Kim et al. |
| 7,433,811 | B2 | 10/2008 | Gao et al. |
| 8,270,781 | B2 * | 9/2012 | Lo .................... B01L 3/502707 385/12 |
| 2006/0046417 | A1 | 3/2006 | Kobayashi et al. |
| 2007/0207487 | A1 | 9/2007 | Emig et al. |
| 2009/0227109 | A1 | 9/2009 | Yang et al. |
| 2012/0112163 | A1 | 5/2012 | Tran et al. |
| 2013/0016942 | A1 * | 1/2013 | Gubenko ............ G02B 6/1228 385/14 |

OTHER PUBLICATIONS

Chen et al., "Maskless fabrication of concave microlens arrays on silica glasses by a femtosecond-laser-enhanced local wet etching method," Optics Express, vol. 18, pp. 20334-20343, 2010.

Edwards et al., "Optically monitoring and controlling nanoscale topography during semiconductor etching," Light Science & Applications 1, e30, 7 pages, 2012.

Edwards et al., "Digital projection photochemical etching defines gray-scale features," Optics Express, pp. 13547-13554, 2013.

Jewell et al., "Vertical-Cavity Surface-Emitting Lasers: Design, Growth, Fabrication, Characterization," IEEE Journal Quantum Electronics, vol. 27, pp. 1332-1346, Jun. 1991.

Jung et al., "Enhanced light extraction of nonpolar a-plane (11-20) GaN light emitting diodes on sapphire substrates by photo-enhanced chemical wet etching," Optics Express 18, pp. 9728-9732, 2010.

Kim et al., Computer-controlled dynamic mode multidirectional UV lithography for 3D fabrication, Journal Micromechanics Microengineering, vol. 21, pp. 1-14, 2011.

Kohl, "Photoelectrochemical etching of semiconductors," IBM Journal Res. Develop., vol. 42, pp. 629-637, Sep. 1998.

Lowes et al., "Photochemical Etching of N-Inp as a Function of Temperature and Illumination," Journal of Applied Physics 68, pp. 814-819, 1990.

Maruo et al., "Three-dimensional microfabrication with two-photon-absorbed photopolymerization," Optics Letters vol. 22, No. 2, pp. 132-134, Jan. 15, 1997.

Ostermayer et al., "Photoelectrochemical etching of p-GaAs," Applied Physics Letter, 39, pp. 76-78, 1981.

Ruberto et al., "The Laser-Controlled Micrometer-Scale Photoelectrochemical Etching of Iii-V Semiconductors," Journal Electrochemical Society, vol. 138, No. 4, 1174-1185, Apr. 1991.

Sun et al., "Three-dimensional photonic crystal structures achieved with two-photon-absorption photopolymerization of resin" Applied Physics Letters, 74, pp. 786-788, 1999.

Wang et al., "Laser direct-write gray-level mask and one-step etching for diffractive microlens fabrication," Applied Optics, vol. 37, pp. 7568-75 76, Nov. 10, 1998.

Wang et al., "Magnetic Nickel-Phosphorus/Polymer Composite and Remotely Driven Three-Dimensional Micromachine Fabricated by Nanoplating and Two-Photon Polymerization" Journal of Physical Chemistry C, pp. 115, 11275-11281, 2011.

Wysocki et al., "Near-field optical nanopatterning of crystalline silicon," Applied Physics Letters, vol. 84, No. 12, pp. 2025-2027, Mar. 22, 2004.

Yu et al., "The evaluation of photo/e-beam complementary grayscale lithography for high topography 3D structure," Proceedings of SPIE 8682, 868212, 2013.

* cited by examiner

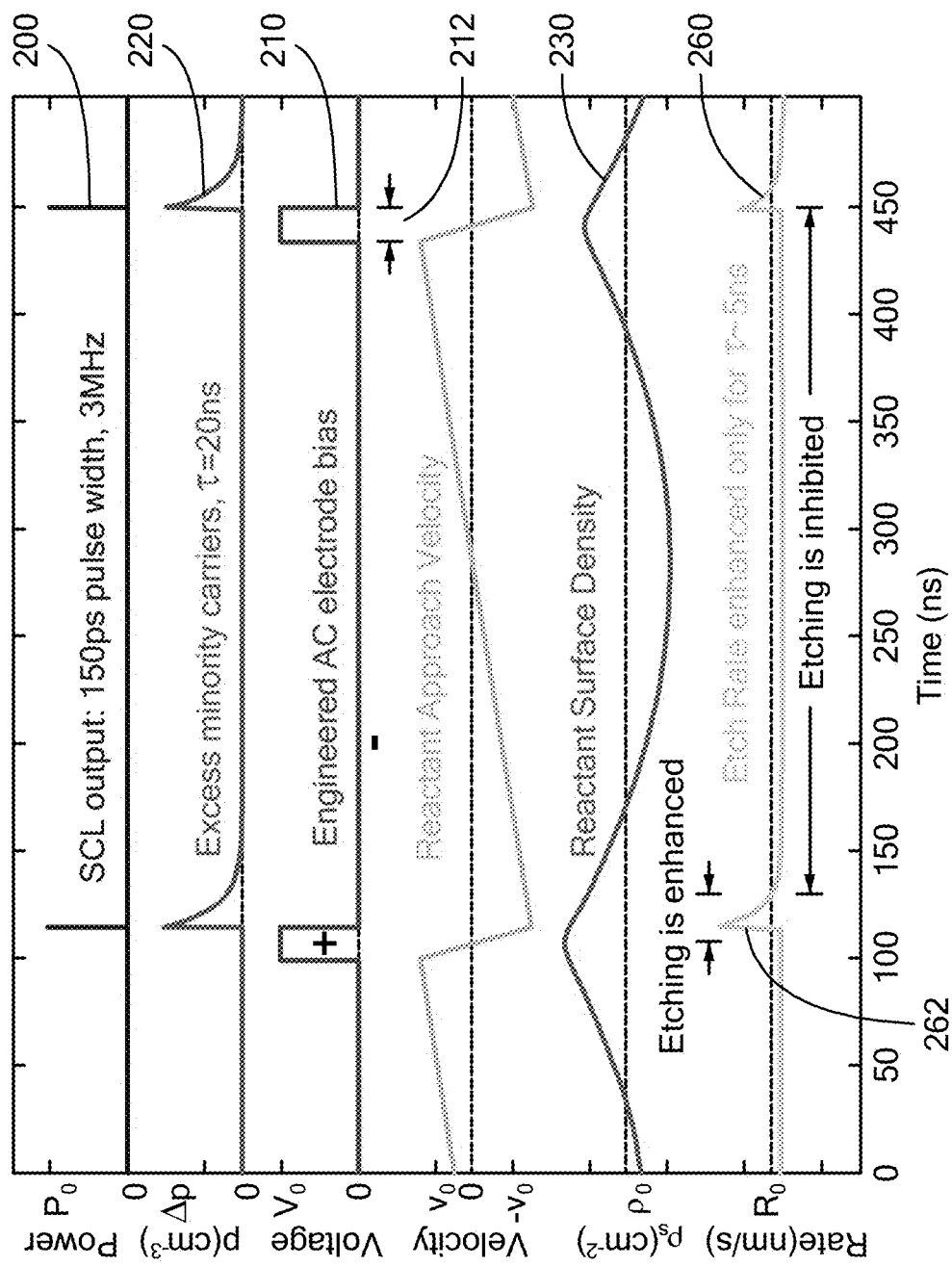

Pattern BCB

Etch Microfluidic Channel

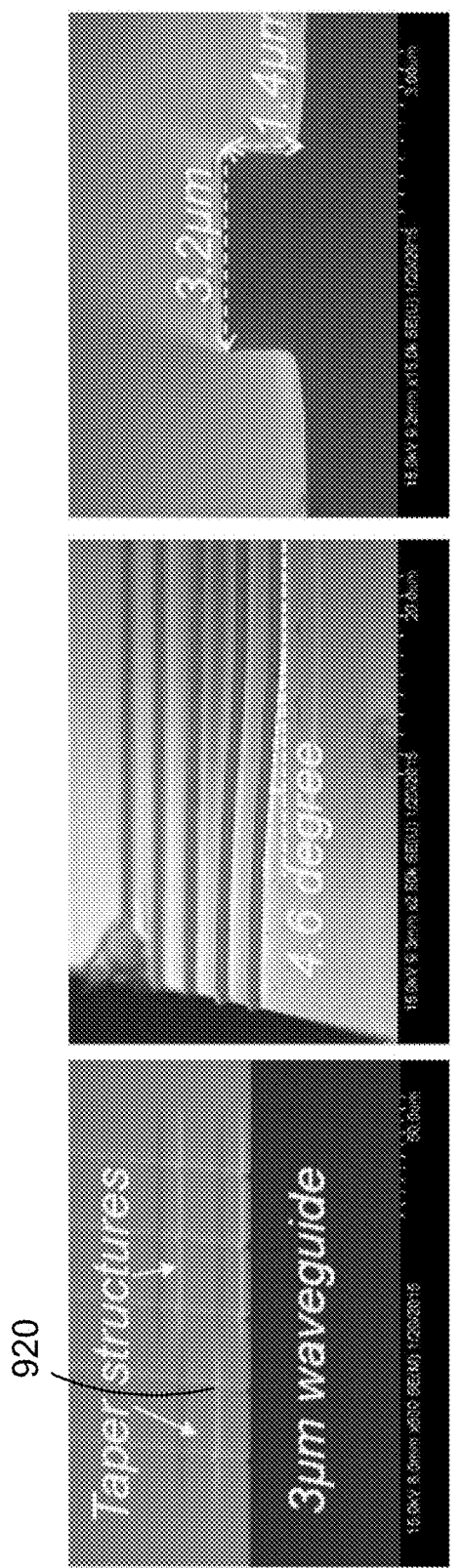

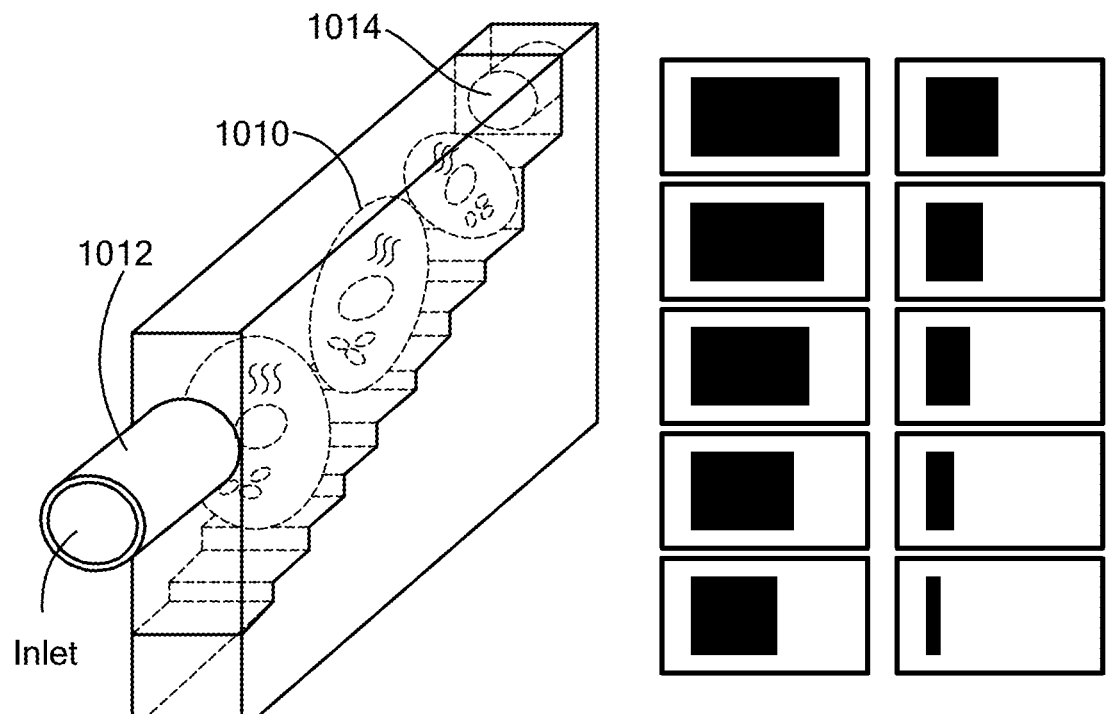
*Fig. 10A*
*Fig. 10B*
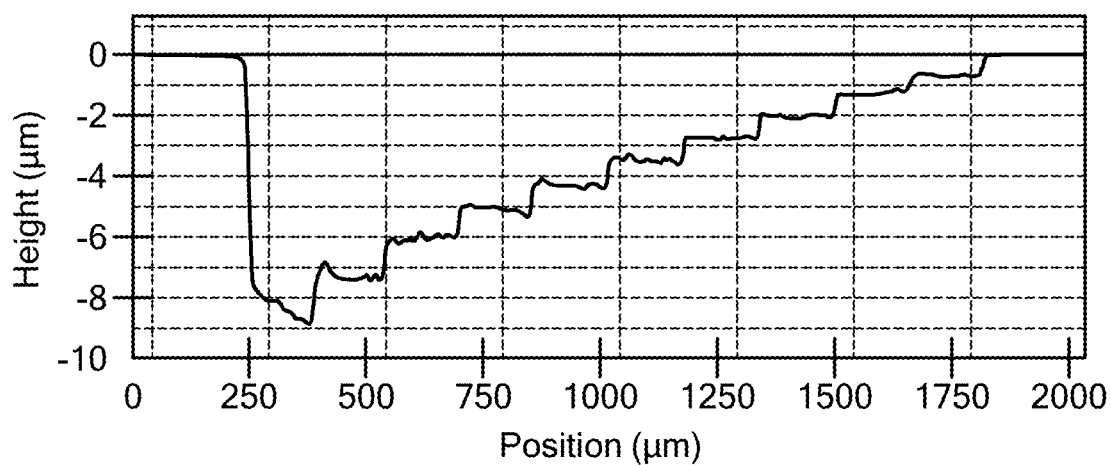
*Fig. 10C*

SPECTRALLY AND TEMPORALLY ENGINEERED PROCESSING USING PHOTOELECTROCHEMISTRY

The present application is a continuation of U.S. Ser. No. 14/988,895, now issued as U.S. Pat. No. 10,115, 599, itself a continuation-in-part of U.S. Ser. No. 13/630,286, now issued as U.S. Pat. No. 9,255,791. Both of the foregoing applications are incorporated herein by reference.

This invention was made with government support under Grants CBET 1040462, awarded by the National Science Foundation. The Government has certain rights in the invention.

TECHNICAL FIELD

The present invention relates to methods and apparatus for maskless photochemical etching of materials, and, more particularly, to photochemical etching of three-dimensional structures in semiconductors.

BACKGROUND ART

Definitions: "Grayscale topography," in the context of semiconductor device fabrication, is a defined term referring to the field of variable height three-dimensional nanostructures patterned into a substantially planar surface. The term "variable height" is defined to mean that the depth of features relative to a fiducial plane is a function of displacement within the plane. Thus, height along one axis is a function of lateral displacement transverse to that axis. The term "grayscale topography" encompasses techniques that may, or may not, employ photoresist, whether directly written or exposed via a mask. It is to be noted that, while some literature uses the term "grayscale lithography" in the limited sense of a class of methods for modulating a local energy dose to expose resist thereby producing a three-dimensional (3D) structure during the development step, the term is not so limited in the context of the present description.

"High aspect-ratio," as the term is used herein and in any appended claims, refers to a structure etched into a substantially planar surface where the ratio of depth relative to the surface with respect to the lateral run over which that depth is varied results in a depth step that exceeds 50%. For example, an etch exceeding 500 nm in depth over no more than 1 µm lateral displacement would constitute a high-aspect-ratio etch.

Where the terms "short," "intermediate," and "long" are used to characterize wavelengths, in the present description and in any appended claims, the aforesaid terms are used in a relative sense, which is to say that a short wavelength is shorter than an intermediate wavelength, and that a long wavelength is longer than either a short or an intermediate wavelength.

Similarly, the terms "narrow bandgap," "medium bandgap," and "wide bandgap," as applied, for example, to semiconductor materials, are defined to have relative meaning. That is to say that a narrow bandgap material has a narrower bandgap (i.e., a smaller energy gap between the maximum energy of the valence band and the minimum energy of the conduction band) than a medium bandgap material, and that a wide bandgap material has a wider bandgap than either a narrow bandgap or a medium bandgap material. For avoidance of doubt, it is to be noted that bandgap of silicon is not intended as the standard of comparison for narrow and wide bandgaps, in the current context.

A general reference to the state of the art in microfabrication techniques may be found in Campbell, *Fabrication Engineering at the Micro-and Nanoscale*, 4$^{th}$ ed., Oxford U. Press (2013), which is incorporated herein by reference. Three-dimensional structures with multiple heights are difficult to achieve using conventional photolithography and etching. Currently, various techniques are employed in the fabrication of semiconductor devices with grayscale topography in particular, and, some of these techniques have entered routine use. Two-photon and multidirectional ultraviolet (UV) photopolymerization of resists are examples of techniques that have been used to realize complex 3D micro- and nano- fabricated patterns. Photo/e-beam complementary grayscale lithography is taught, for example, by Yu et al., "*The evaluation of photo e-beam complementary grayscale lithography for high topography 3D structure,*" *Proceedings of SPIE* 8682, 868212 (2013), incorporated herein by reference.

To fabricate such structures, gray-scale masks can be used, which allow varying amounts of light to pass through and photoactivate a resist applied to the substrate prior to etching. These masks, however, have a limited number of gray levels, are very expensive since the cost scales with the number of levels, and may require several iterative purchases while a given process is perfected. More importantly, gray-scale masks are static and thus cannot easily be modified if the design dimensions or device layout is changed.

As a consequence, focus has been shifted to direct writing techniques which use lasers as the etching tool, rather than gray-scale masks. More complex structures can be created if laser scanning is used, such as the microlens array produced according to the teachings of Chen et al., "*Maskless fabrication of concave microlens arrays on silica glasses by a femtosecond-laser-enhanced local wet etching method,*" *Opt. Exp.*, vol. 18, pp. 20334-43 (2010), incorporated herein by reference. Multiple laser beams may be employed to bypass the diffraction limit and obtain sub-micron gratings and nanostructures. Serial laser writing, however, requires precise scanning equipment and software control, and the throughput is relatively low.

Traditionally, photochemical and photoelectrochemical etching have been most often used to improve the material selectivity of particular etching steps within a fabrication process. A survey of the state of the art as of its publication may be found in Kohl, "*Photoelectrochemical etching of semiconductors,*" *IBM J. Res. Dev.*, vol. 42, pp. 629-37 (1998) (hereinafter, "Kohl (1998)") , which is incorporated herein by reference. Various structures have been fabricated using laser-assisted wet etching, however laser-assisted wet etching has, to date, required proximity masking in order to achieve competitive results.

Although surface topography can be transferred to a semiconductor or other substrate with an etch of appropriate selectivity, it is difficult to transfer the topography of free standing structures with this method or to use the method to perform other types of semiconductor processing, e.g. doping or metallization. Photochemical etching is suited to directly pattern the semiconductor with grayscale topography. When light with sufficient energy is absorbed near the surface of a semiconductor material, minority carriers are generated that can then diffuse to the surface and act as a catalyst in the etching process. As a result, the etch depth for different materials in a given etching solution can be controlled by varying the irradiance, wavelength, or exposure time of the incident light. That much is already known in the art.

Maskless photoelectrochemical etching of 3D structures has been suggested in U.S. Pat. No. 7,433,811 ("Gao"), which is incorporated herein by reference. However, what has eluded achievement to date is one-step etching of multi-level structures by jointly controlling both the temporal and spectral characteristics of the photochemistry-initiating light source as well as the flow of charge carriers in the etched medium, thereby selectively gating aspects of the etching process. That breakthrough is taught in accordance with the present invention.

SUMMARY OF EMBODIMENTS OF THE INVENTION

In accordance with certain embodiments of the invention, methods are provided for fabricating a specified structure in a semiconductor substrate. One method has steps of:
  applying an etch solution to the surface of the semiconductor substrate;
  generating a spatial pattern of electron-hole pairs by projecting a spatial pattern of illumination characterized by a specified intensity, wavelength and duration at each pixel of a plurality of pixels on the surface of the semiconductor substrate; and
  applying an electrode bias for enhancing etch rate during a time gated window short compared to the carrier recombination lifetime.

In other embodiments of the invention, temporally controlling the spatial pattern of illumination may include displaying a sequence of two or more images.

In accordance with further embodiments, temporally controlling the spatial pattern of illumination may include using a projector that employs pulse width modulation to set the gray scale intensity.

In other embodiments of the invention, projecting the spatial pattern may include generating the illumination with a source selected from the group of sources including a projector, a supercontinuum laser, an optical parametric oscillator, a mode locked laser and a tunable laser.

In accordance with alternate embodiments of the invention, projecting the spatial pattern may include modulating a specified intensity or duration of illumination of each pixel with a spatial light modulator and may also include spectrally filtering the illumination within a path between a source of broadband light and the semiconductor substrate.

In accordance with further embodiments, applying an electrical potential across the interface between the semiconductor and the etch solution may further include controlling etch depth. Applying an electrical potential across the etch solution may further include applying a DC bias potential.

The etch solution may comprise an acid and water, and optionally, also an oxidizer, or a base and water, again, with the optional addition of an oxidizer.

In accordance with another aspect of the present invention, an apparatus is provided for fabricating a specified structure in a semiconductor substrate. The apparatus has a source of light, a modulator for modulating a duration of illumination of the semiconductor substrate, a spectral filter for defining a spectral characteristic of light from the source that is incident upon the semiconductor substrate, and a spatial light modulator for defining the spatial pattern of illumination incident on the semiconductor substrate. Additionally, the apparatus has a container, such as a beaker, for maintaining an etch solution in contact with the surface of the semiconductor substrate, an electrode for maintaining a potential across the etch solution relative to the semiconductor substrate, and a processor for governing a temporal relationship between the duration of illumination and the potential across the interface between the semiconductor and etch solution.

In other embodiments of the present invention, a potentiostat may be used to control the electrical potential of the semiconductor and the electrical potential of the etch solution relative to a reference electrode.

In other embodiments of the present invention, the source of light may be a projector, or may be chosen from a group of sources including a supercontinuum laser, an optical parametric oscillator, a mode locked laser or a tunable laser. The apparatus may also have a spectral filter in a path between the source of light and the semiconductor substrate. The apparatus may also have a chemical circulator for introducing fresh etch solution into contact with the semiconductor substrate, and a pulse generator adapted to pulse the electrical potential at a rate between 0.001 Hz and 1000 Hz. The pulse generator may also be adapted to pulse the electrical potential with a pulse width of between 100 fs and 1 ns at a rate of between 100 kHz and 1 GHz.

In accordance with yet another aspect of the present invention, a method is provided for fabricating a photodetector integral with a parabolic reflector. The method has steps of:
  photoelectroplating a top-contact metal-semiconductor-metal photodetector on a semiconductor wafer;
  applying the fabrication methods above to define a parabolic surface on a semiconductor wafer; and
  applying an electrical potential across the etch solution with a specified temporal profile relative to the duration of the spatial pattern of illumination.
The semiconductor wafer may be a silicon-on-insulator structure or other suitable materials as known in the art.

In accordance with a further embodiment of the invention, a method is provided for fabricating a cell size sorting chip. The method has steps of:
  etching a concentric series of discrete height steps into a surface of a semiconductor substrate using methods described above;
  covering the surface of the semiconductor substrate with a platen having a substantially planar surface; and
  mounting the semiconductor substrate and platen for centrally receiving a flux of cells suspended in a fluid and for rotation about a central axis.
  profile relative to the duration of the spatial pattern of illumination.

In accordance with a another embodiment of the present invention, a method is provided for fabricating a cell size sorting chip, where the method has steps of:
  etching a linear channel containing a series of discrete height steps into the surface of a semiconductor substrate using the methods described above;
  covering the surface of the semiconductor substrate with a platen having a substantially planar surface; and
  coupling microfluidic inlet and outlet tubes to the linear channel in such as manner as to provide for the flow of cells suspended in a fluid through the channel.

In still another embodiment of the invention, a method is provided for fabricating a three-dimensional photonic bandgap chip. The method has steps of:
  growing a layered stack of triads of narrow bandgap, medium bandgap, and wide bandgap semiconductor with a top layer characterized by a center;

etching a periodic array of holes using the fabrication method above at a short wavelength such that all layers are etched;

displaying a uniform pattern of light at an intermediate wavelength so as to cause lateral etching in exposed regions of selected layers, thereby forming a photonic crystal; and illuminating through the center of the top layer causing absorption in the narrow bandgap material and creation of a defect cavity.

In the foregoing method, the narrow bandgap semiconductor may be GaAs, for example.

In accordance with another embodiment, a method for fabricating a photonic integrated circuit is provided that has steps of:

growing a layered stack of semiconductor materials;

creating an adiabatic taper between an active section and a passive section by displaying a gradient pattern of light intensity to slowly vary the etch height; and defining a photonic device in at least one of the active and passive sections using at least one of conventional photolithography, dry etching, and deposition, and illuminating with a pattern of light in such a manner as to cause etching, doping, or metallization.

Within the scope of the present invention, there may also be additional steps of:

planarizing the surface using a planarization polymer;

etching vias to allow chemical etchants to enter and exit; and illuminating a path connecting the entrance and exit vias to create a microfluidic channel.

In accordance with a further aspect of the present invention, a method is provided for fabricating a photonic integrated circuit, wherein the method has steps of:

growing a layered stack of semiconductor materials;

creating an adiabatic taper between an active section and a passive section by displaying a gradient pattern of light intensity to slowly vary the etch height; and defining at least one photonic device in at least one of the active and passive sections using at least one of conventional photolithography, dry etching, conventional deposition, and photoelectrochemical processing by illuminating with a pattern of light in such a manner as to cause etching, doping, or metallization.

In the foregoing method, there may also be steps of:

planarizing the surface using a planarization polymer;

etching vias to allow chemical etchants to enter and exit; and illuminating a path connecting the entrance and exit vias to create a microfluidic channel.

In another embodiment yet, a method is provided for creating a spatially varying doping profile in a semiconductor substrate. The method has steps of:

generating a spatial pattern of electron-hole pairs by projecting a spatial pattern of illumination characterized by a specified intensity, wavelength and duration at each pixel of a plurality of pixels on the surface of the semiconductor substrate; and applying an electrical potential to an electrode made of a dissolvable doping material relative to the semiconductor, wherein the semiconductor substrate and the dissolvable doping material are both suspended in a solution, in such a manner as to create a current of doping ions that attach to the surface of the semiconductor at locations determined by the generated electron-hole pairs.

In other embodiments, there may be an additional step of annealing the semiconductor wafer in an oven in such a manner as to promote the diffusion of doping ions from the surface of the semiconductor into the bulk semiconductor. For doping of GaAs, the dissolvable doping material may include at least one of magnesium, zinc, or other doping ions known in the art dissolved within the solution.

In accordance with a further aspect of the present invention, a method is provided for metallizing a semiconductor substrate. The method has steps of:

generating a spatial pattern of electron-hole pairs by projecting a spatial pattern of illumination characterized by a specified intensity, wavelength and duration at each pixel of a plurality of pixels on the surface of the semiconductor substrate; and applying an electrical potential to an electrode made of a dissolvable metal relative to the semiconductor, wherein the semiconductor substrate and the dissolvable metal are both suspended in a solution, in such a manner as to create a current of metal ions that attach to the surface of the semiconductor at locations determined by the generated electron-hole pairs.

The metalizing method may also have a step of annealing the semiconductor substrate in an oven in such a manner as to reduce the resistance of an Ohmic contact or to modify the barrier height of a Schottky barrier contact relative to absence of annealing. The dissolvable metal may include one of gold and nickel.

BRIEF DESCRIPTION OF THE DRAWINGS

The present patent or application file contains at least one drawing executed in color. Copies of this patent with color drawing(s) will be provided by the Patent and Trademark Office upon request and payment of necessary fee.

The foregoing features of the invention will be more readily understood by reference to the following detailed description, taken with reference to the accompanying drawings, in which:

FIGS. 2A, 2B, 2C, 2D, 2E and 2F display time plots of quantities associated with time-gated photoelectrochemical etching, in accordance with embodiments of the present invention.

FIG. 10A is a cut-away perspective view of a stepped guide structure fabricated in accordance with an embodiment of the present invention. FIG. 10B depicts an illumination pattern sequence used in the fabrication of the structure of FIG. 10A, and FIG. 10C plots a cross-section of the stepped structure fabricated in accordance with an embodiment of the present invention.

DETAILED DESCRIPTION OF EMBODIMENTS OF THE INVENTION

Figure 1A:
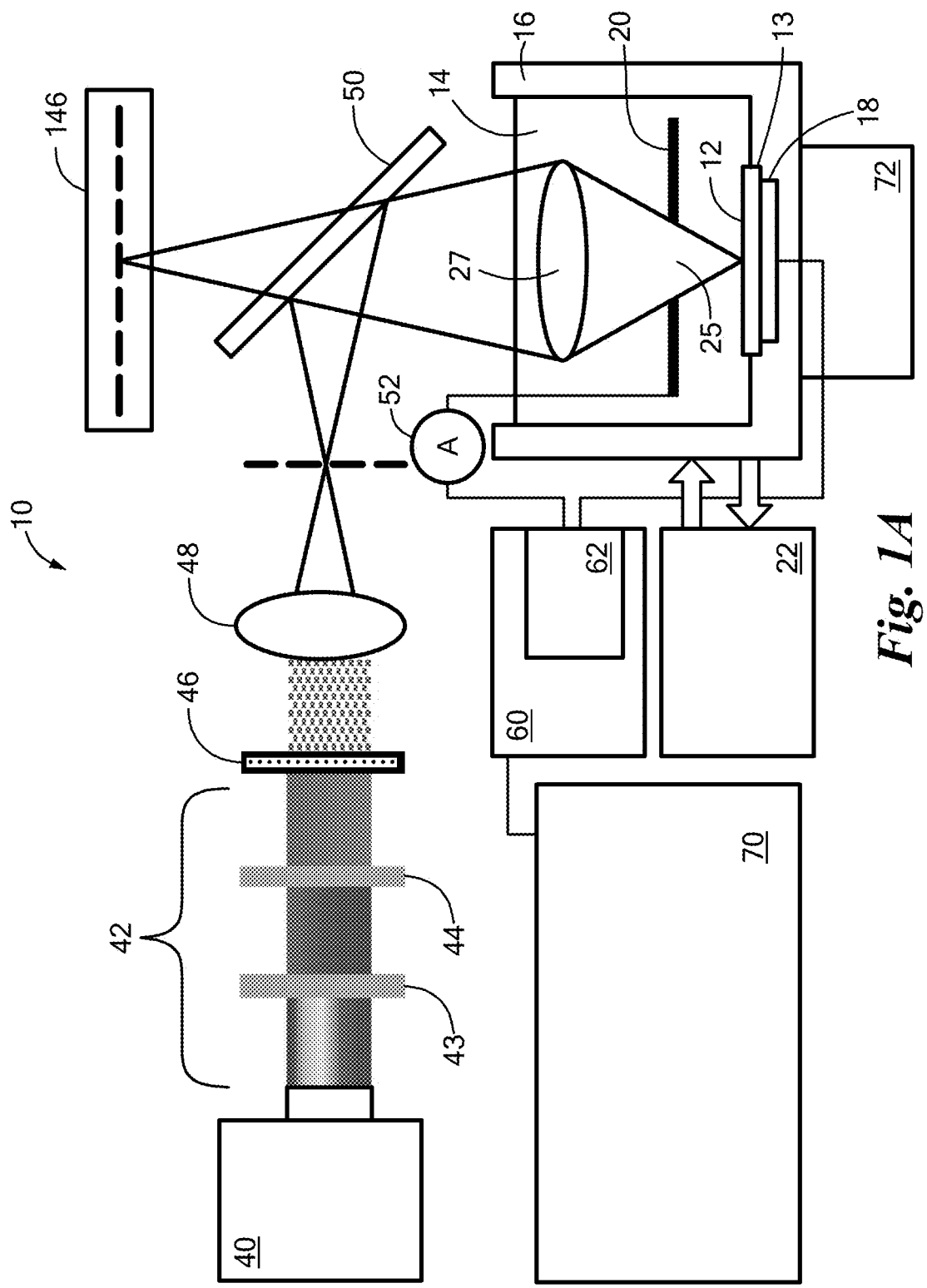
FIG. 1A shows a schematic layout of a semiconductor processing apparatus, in accordance with an embodiment of the present invention.

Definitions: The term "image" shall refer to any multidimensional representation, whether in tangible or otherwise perceptible form, or otherwise, whereby a value of some characteristic (amplitude, phase, etc.) is associated with each of a plurality of locations corresponding to dimensional coordinates of an object in physical space, though not necessarily mapped one-to-one thereonto. Thus, for example, the graphic display of the spatial distribution of some field, either scalar or vectorial, such as brightness or color, constitutes an image. So, also, does an array of numbers, such as a 3D holographic dataset, in a computer memory or holographic medium. Similarly, "imaging" refers to the rendering of a stated physical characteristic in terms of one or more images.

Terms, as employed herein and in any appended claims, shall have the meanings attributed as follows:

"Slow" variation of etch height shall mean that the depth of etch relative to a fiducial plane shall vary with a spatial gradient nowhere exceeding 500 nm per micrometer.

An "active section" shall refer to any portion of an electronic device adapted to permit control of the flow of charge carriers.

A "passive section" shall refer to any portion of an electronic device that is not adapted to permit control of the flow of charge carriers.

The term "photonic device" shall be used, without limitation, to denote any component for generating photons or for manipulating or detecting them, in any part of the electromagnetic spectrum, and may include, without limitation, lasers, modulators, filters, detectors, and waveguides.

A "photonic integrated circuit," as the term is used herein, shall refer to a photonic device which integrates at least two distinct photonic functions (such as generating light and guiding light, or switching light and detecting light) onto a single monolithic structure.

The term "conventional lithography," as the term is used herein, shall mean photolithography applied to the fabrication of semiconductor devices using development of a photoresist applied to a surface of a semiconductor following exposure of the photoresist through a mask.

A "planarization polymer" shall denote any polymeric material that adheres to a semiconductor and that may be deposited onto a semiconductor surface that need not be planar and that results in formation of a polymer surface that is substantially planar. Benzocyclobutene (BCB) is a (non-limiting) example of a planarization polymer.

The term "adiabatic taper" shall denote a transition between waveguides that has the property that an optical mode propagating in one waveguide is substantially preserved on coupling to the second waveguide, without any substantial coupling to a mode of higher order or to any radiative mode.

The composition of a crystalline material shall be denoted "continuously varying," if the atomic composition of each unit cell of the crystalline material, whether stoichiometric or otherwise, exhibits a non-zero gradient in at least one direction. "Substantially continuously varying" shall denote that the gradient need not be measurable from one unit cell to each nearest neighbor unit cell in order for the property of continuous variation of composition to obtain.

Photochemical Etching

A photoelectrochemical (PEC) etching apparatus (otherwise referred to herein as a "PEC system"), designated generally by numeral 10, may be used for fabricating gray-scale semiconductor structures in accordance with an embodiment of the present invention as now described with reference to FIG. 1A. Photochemical etching is described, for example, in Houle, *Photochemical etching in silicon: the influence of photogenerated charge carriers, Phys. Rev. B*, vol. 39, pp. 10120-32, (1989), which is incorporated herein by reference. Since the etch rate for most semiconductors is limited by the supply of minority carriers to the surface, illumination accelerates the etching process. In some semiconductors, however, supplying minority carriers can reduce or can completely stop the etching process. Photochemical etching techniques are particularly well suited for fabricating complex gray-scale structures which are typically very difficult or expensive to produce using standard photolithographic techniques.

In the PEC apparatus 10 of FIG. 1A, at least an upper surface 12 of a semiconductor substrate 13 is exposed to an etch solution 14, typically contained within a beaker 16, where "beaker" is a term used to refer to any containment vessel, or, equivalently, "container." Etch solution 14 may also be referred to herein synonymously as an "etchant." Semiconductor substrate 13 may be silicon, for example, however all semiconductor materials fall within the scope of the present invention. Semiconductor substrate 13 may also be referred to herein as a "wafer." A chemical circulator 22 serves to keep etch solution 14 in motion, thereby improving process uniformity allowing different solutions to be used for further processing (e.g. photoelectroplating/doping). Chemical circulator 22 consists of reservoirs and tubes to flow new chemicals into the beaker and receive old chemicals. Optionally, a magnetic stirrer (not shown) may be used to mix the solution.

The fundamentals of PEC etching are well known in the art, and need not be described here, insofar as reference to Kohl (1998) will suffice as background to persons of ordinary skill in the art. An electrical potential, the temporal properties of which are the subject of detailed discussion below, is applied between a first electrode 18, coupled by electrical contact to the semiconductor substrate 13, and a second electrode 20, coupled by electrical contact to the etch solution 14. The electrical potential is provided by an electrical pulse generator 60, governed by processor 70, which may, more particularly, define temporal delays relative to a clock pulse. Current flow between the electrodes 18 and 20 and through etch solution 14 may be monitored using a current sensor 52. A potentiostat (not shown) may be used to control the electrical potential of the semiconductor and the electrical potential of the etch solution relative to a reference electrode (not shown). Techniques for control of electrical potential in the context of electrochemical processes may be found in Bard, et al., *Electrochemical Methods: Fundamentals and Applications*, (Wiley, 2d ed., 2000), which is incorporated herein by reference. A potentiostat may be obtained from Gamry Instruments of Warminster, Pa.

In PEC, selected portions of upper surface 12 of semiconductor substrate 13 are exposed to light 300 (shown in FIG. 3) generated by a source 40 of light, otherwise referred to simply as a "source." Light from source 40 generates charge carriers 305 (electron-hole pairs) in the semiconductor 13 by photoabsorption, thereby enhancing chemical reaction and thus etch rate at the interface of the semiconductor 13 and the etchant 14. As described in Kohl (1998), at pages 630 and 635, for example, steps associated with the PEC reaction include oxidation, reduction, and byproduct removal phases.

Light source 40 is preferably a high pulse power laser emitting at multiple wavelengths such as a super-continuum laser (SCL), an optical parametric oscillator (OPO), a mode locked laser (MLL) or a tunable laser (TL), although any light generator or projector may be used within the scope of the present invention. For example, light source 40 may be a ViewSonic high-definition projector outputting a standard 1920×1080 optical image in accordance with the 1080p video standard. Other components of the PEC etching apparatus 10, may include one or more of the following parts: a tunable filter 42 (otherwise referred to as a "tunable filter system"), and a spatial light modulator (SLM) 46. Tunable filter 42 may include a short pass filter 43 and a long pass filter 44, each mounted on filter wheels for selection from among a set of filters, and other optical components well known for defining the spectrum of an optical beam. The SLM 46 may impose a specified spatial pattern of illumination on surface 12 of semiconductor substrate 13 when illuminating beam 25 is focused via a focusing optical system that may include lens 27 shown by way of example only. Lens 27 may be submerged in the etchant solution (as shown) to increase the numerical aperture and thus improve the optical resolution. Lens 27 may also be positioned above the etchant and kept dry in cases where there is material incompatibility with the etchant. Reflective optics may also be employed in the focusing optical system, within the scope of the present invention.

The duration of illumination of any position on surface 12 may be modulated, in some embodiments, by the light source itself (an SCL, OPO, or MLL can generate pulses on the order of 100 fs-1 ns wide at repetition rates in the range of 100 kHz -1 GHz) or by the SLM 46, although switching rates of SLMs are currently limited by the current state of the art, to speeds in the range of 1 Hz-1 MHz per pixel. In a preferred embodiment of the invention, pulses in the range of 0.001-1000 Hz are preferred, with the rate of 0.5 Hz especially preferred, so that the oxidation, reduction, and byproduct removal steps of the chemical reaction for etching are self-limiting by virtue of temporally gating by the electrical potential, thereby enabling a single atomic layer of semiconductor material to be removed per pulse cycle.

Figure 4A:
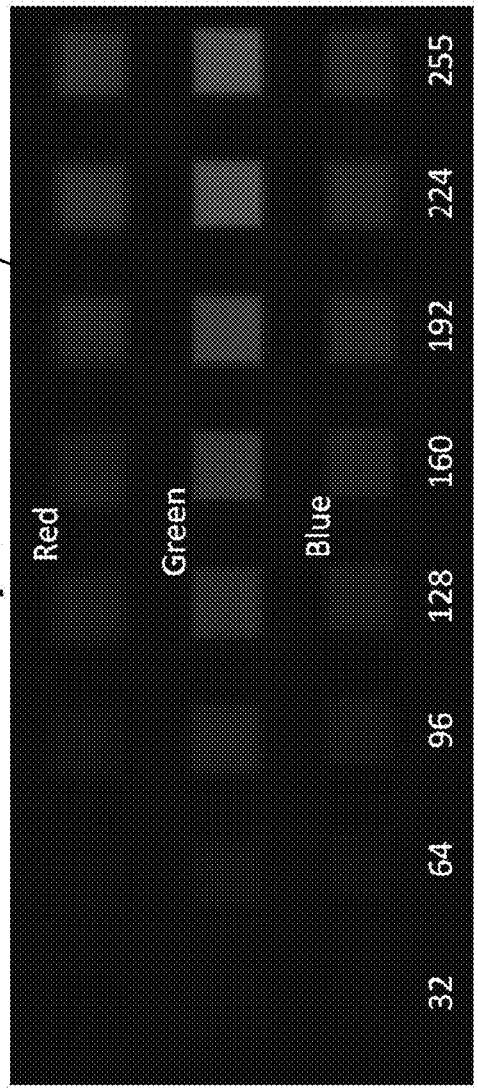
FIG. 4A shows a pattern focused onto a sample plane.

Etch rates due to different spectral and intensity characteristics of the illumination is now discussed with reference to FIGS. 4A-4E. FIG. 4A shows a projected pattern of squares 410 used for determining the etch rates. Eight 30 μm squares 410 which contain gray-levels of 32, 64, 96, 128, 160, 192, 224, and 255 were created for each color: red, green, and blue. To begin, 10 mL of 1:1:50 $H_3PO_4:H_2O_2:H_2O$ etch solution 14 was poured into beaker 16. The sample semiconductor substrate ($n^+$ GaAs) 13 was then placed into beaker 16 containing the etch solution 14 and placed onto a microscope stage, directly under an objective lens (or "objective") 27.

Figure 4B:
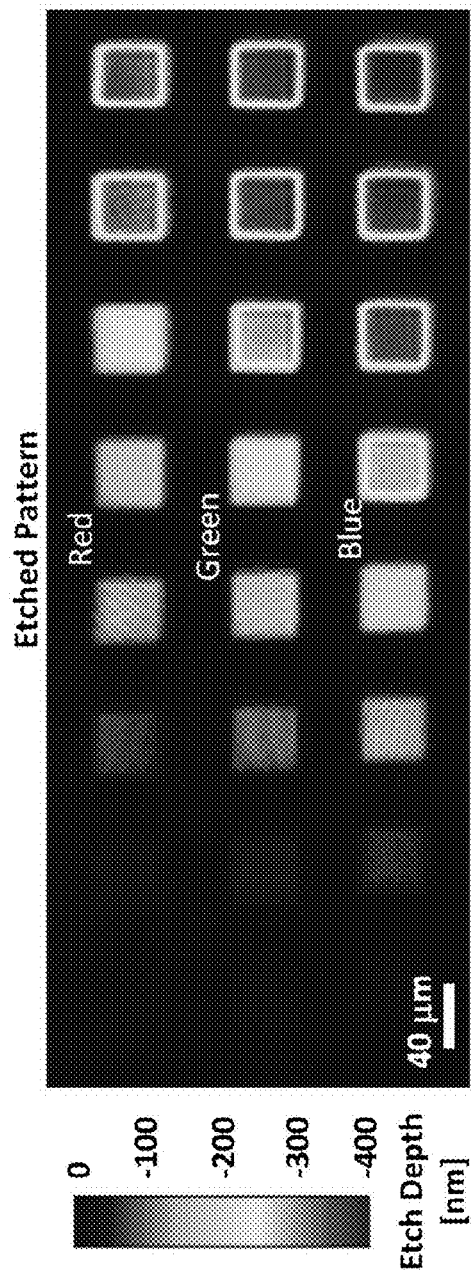
FIG. 4B is a false-color image depicting a corresponding height measurement of squares etched into a substrate.
Figure 4C:
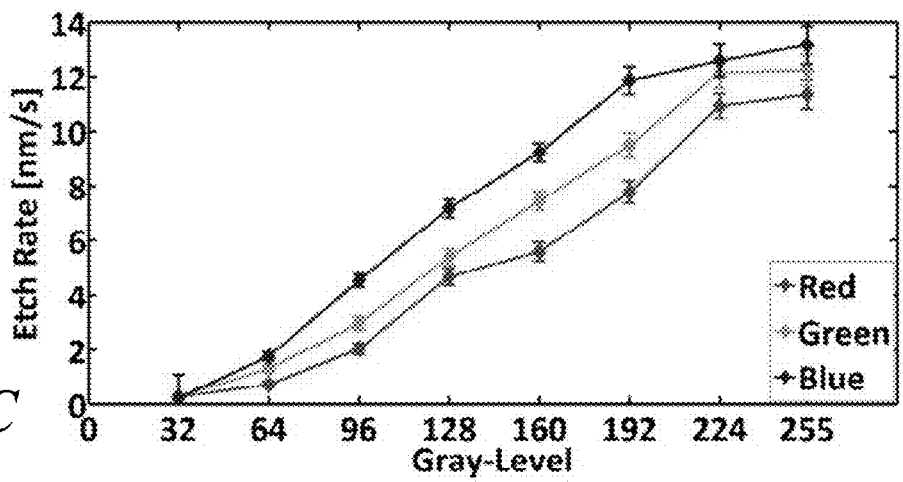
FIGS. 4C, 4D and 4E plot the differential etch rates relative to a 1.1 nm/s dark etch rate for three colors as functions of gray level, irradiance and photon flux, respectively, in accordance with an embodiment of the present invention.
Figure 4D:
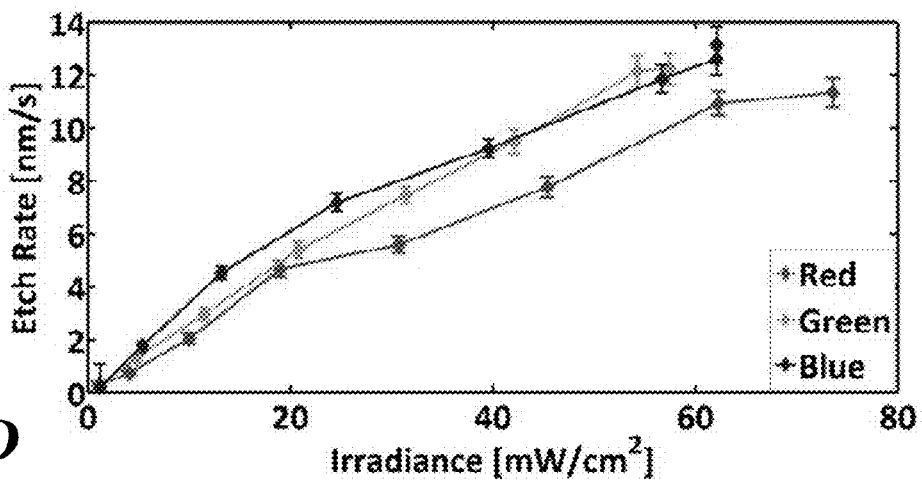
Figure 4E:
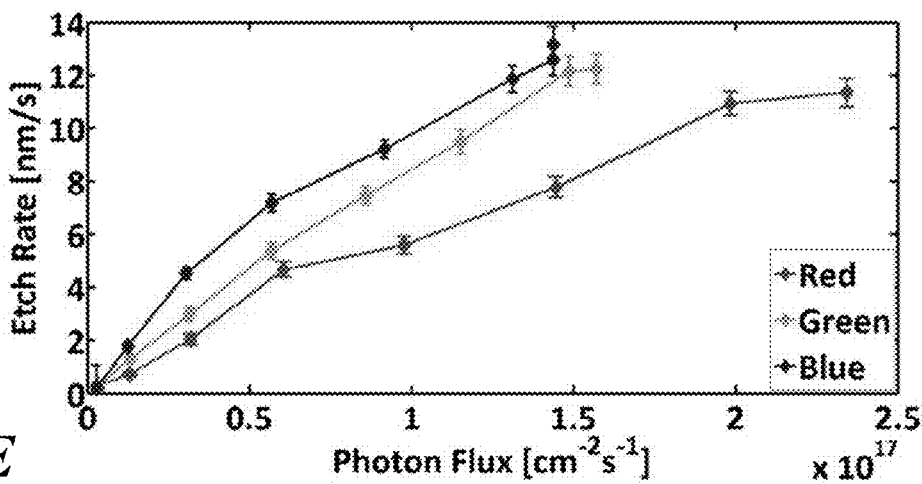

FIG. 4B shows the etch depth of the squares. The differential etch rates as a function of the gray-level for each color component were calculated using the recorded etch time and measured etch depths. The result is plotted in FIG. 4C. The incident power was measured in the sample plane so that the photochemically-induced etching versus irradiance could be plotted in FIG. 4D and the photochemically-induced etching on a per photon basis, i.e., per photon flux, could be computed, as plotted in FIG. 4E. There is a clear separation between the etch rates for the different colors in FIG. 4E. The bandgap of GaAs is $E_g=1.43$ eV (i.e., GaAs absorbs below $\lambda_{max}=868$ nm). The skin depth for light absorption is 2.55 μm, 1.26 μm and 0.81 μm at 633 nm, 532 nm, and 488 nm, respectively. In general, shorter wavelength light will result in higher etch rates (per photon) because carriers are created closer to the surface. The etching process is initially reaction-limited by the oxidation process. Incident light produces minority carriers (holes) that assist with oxidation. The etch rate begins to saturate at high intensities when the process becomes diffusion-limited. At this point, the local reagents are being consumed too quickly and the rate is slowed as new species must diffuse into the regions near the surface. To avoid saturation, a more concentrated etching solution can be used or the stirring rate can be increased. Finally, the background (dark) etch rate was measured to be 1.1 nm/s. This allows the absolute etch rate for the different colors and gray-levels to be computed. These absolute etch rates were used to compute the etch times required for a desired etch depth (or height) in subsequent etches.

Various electrical bias protocols may be employed in accordance with the present invention. In accordance with one class of such protocols, an AC electrical bias, synchronized with the illumination as described in detail below, is applied across electrodes 18 and 20 by electrical pulse generator 60 to improve resolution, anisotropy, and selectivity. In accordance with another class of such protocols, a square wave AC electrical bias is applied across electrodes 18 and 20 by electrical pulse generator 60 in synch with the display of two images, i.e. a first image is displayed when the electrical bias is "on" or high and a second image is displayed when the electrical bias is "off" or low, in order to temporally gate individual steps of the overall chemical reaction. Temporal gating can cause the reaction steps to be self-limiting. Self-limiting steps are advantageous because they can enable a precise and repeatable amount of material, e.g. a single atomic layer, to be removed per pulse. Typically, the first image is the desired spatial pattern for the etch while the second image is a black screen so that the light induced chemical reaction steps only occur when the electrical bias is high. Thus, only the pattern in the first image is transferred onto the substrate. Grayscale topography can still be achieved if the pattern for the first image is changed in time. Current, measured by current sensor 52 may be monitored by processor 70 in order to quantify carrier dynamics and measure the photo-electrochemical reaction rate and, thus, infer the etch depth. A 3-axis motorized xyz translation stage 72 moves the sample and beaker relative to objective 27 and electrode 20 to process multiple die on a single wafer 13 (x-y) while maintaining the focus (z) during the etching of deep structures. Alternatively, scanning galvanometer mirrors (not shown) may be used to direct the image to different locations on a sample that is stationary in x-y and translated along z to maintain the focus. Further, the system may include temperature control (not shown) to optimize etch selectivity.

Instead of varying the light intensity level, it is also acceptable, for certain applications, to vary the "on" time of the SLM 46 to control etch depth, and, indeed, this may offer better precision. Furthermore, image focus is maintained, such as by translation of objective lens 27 or the beaker 16, for example, as processing is performed at each z-plane. These changes may provide better uniformity and longer etches and solve an issue with an embodiment of the invention in which features of different heights go out of focus due to different light intensities.

Regarding selection of source 40 of illumination, a 2-Watt SCL, due to its greater radiance (Watts per steradian per square meter), can deliver about 300× more intensity to the sample surface 12 than a computer projector used as a light source, thereby advantageously enabling the patterning of a 100× larger area (e.g., ~1 $cm^2$ instead of 1 $mm^2$) with a 3× higher intensity to achieve a greater photo-induced etch selectivity (e.g., ~36:1 instead of 12:1). Moreover, it provides a much wider bandwidth spectrum (e.g. 400 nm to 2400 nm), with more precise control of wavelengths used, than the three discrete RGB colors of the projector discussed above. An OPO has significantly higher spectral radiance (Watts per steradian per square meter per nanometer) than a SCL and thus after spectral filtering the OPO can deliver even higher intensity to the sample plane. And although the OPO only outputs a few discrete wavelengths instead of a continuous spectrum, these wavelengths can still be tuned over a relatively wide range. This makes the OPO an advantageous illumination source for many applications.

Tunable filter system 42 may provide tighter spectral control than that of a projector, and may enable very precise selective etching. For example, an 800-nm long-pass filter 43 would yield selective etching of GaAs relative to $Al_xGa_{1-x}As$ for x>0.1, while a 900-nm filter would give selective etching of $In_xGa_{1-x}As$ over GaAs for x>0.03. Moreover, spectral control advantageously provides for selective release of layers for micro-electro-mechanical systems (MEMS) devices or to create buried structures that are released using a layer structure such that the light is absorbed only in the release layer, as described below, with reference to FIGS. 7A-7B and 8C-8E. This can also include the creation of one or more microfluidic channels 815 (shown in FIG. 8E) underneath the surface of an integrated circuit chip 810. Preferred embodiments of tunable filter 42 use one or more filter wheels, preferably three motorized filter wheels holding short-pass, band-pass, and long-pass filters, respectively. Each wheel also holds a blank filter. Thus, many spectral combinations can be created at low cost. SLM 46 creates the projected image by controlling the transmitted intensity at each pixel. The desired SLM has at least 4096×2160 pixels. Thus, it offers at least 4× the write area of a system using a projector geared to the 1080p video standard.

Etch solution 14 may be formulated in accordance with a variety of formulations matched to the etching modality to be employed. For example, a mixture of an acid, an oxidizer and water has been found to be effective for controlling the etching rate for p-type, n-type, or intrinsic GaAs with light. An example of such an etchant is a 1:1:50 mixture of $H_3PO_4:H_2O_2:H_2O$. As discussed below, light can increase the etch rate from 1.1 nm/s to 14 nm/s for n-type GaAs. For intrinsic GaAs, light can also increase the etch rate. However, for p-type GaAs, light can inhibit etching and thereby reduce the etch rate. Three dimensional structures can still be fabricated in p-type GaAs by inverting the light intensity pattern, i.e. project an image with black for areas that are to be etched fastest, grey for areas that have moderate etching, and white for areas with slow or zero etching. For n-type, intrinsic, and p-type GaAs, the presence of the oxidizer gives rise to undesirable etching in regions where there is no light for n-type and intrinsic GaAs and in regions where there is light for p-type GaAs. In the absence of the oxidizer, the etching is limited to the illuminated regions for n-type GaAs. Consequently, for n-type GaAs, an acid and water solution may be used to improve the photo-induced selectivity, which is defined as the ratio of the etch rate of the illuminated area to that of the non-illuminated area. An example of such an etchant is a 1:50 mixture of $HCl:H_2O$. For n-type GaAs, this recipe has been found to have zero measurable etch rate without illumination (the etch rate is below 3 nm/hr, which is the detection limit of the measurement system) and an etch rate of 5 nm/s with light. Thus, this recipe yields a nearly infinite photo-induced selectivity. Moreover, this recipe is selective to the doping in that it will not significantly etch intrinsic GaAs (the etch rate is below 30 nm/hr with light and below 3 nm/hr without light) and it will not etch p-type GaAs (the etch rate is below 3 nm/hr both with and without illumination). This can be very useful, allowing intrinsic or p-type GaAs to serve as an etch stop layer.

Under other circumstances, etch solution 14 is preferably formulated from a base and water, as known for fast etching of n-type Si, and as determined to be effective for slow etching of p-type Si. An example of such an etchant is a mixture of $KOH:H_2O$ with concentrations ranging from 0.25M to 8M. Depending on the doping type, concentration and electrical biasing conditions, the etch rate can either be increased or decreased with illumination. Other formulations of etch solution 14 are within the scope of the present invention, including that of a base, an oxidizer, and water. An example of such an etchant is a mixture of 2% $H_2O_2$ with the aforementioned 0.25M-8M $KOH:H_2O$ mixture. For p-type Si, the addition of hydrogen peroxide drastically improves the photo-induced selectivity because it reduces the etch rate in non-illuminated regions to zero (i.e. below the detection limit of the measurement system) while maintaining the etch rate in the illuminated region at approximately 0.14 nm per electrical pulse (i.e. about 1 atomic layer of Si is removed per pulse). The ability to remove a precise and repeatable amount of material per pulse under a variety of operating conditions is highly advantageous. Temporally gating the chemical reactions by synchronizing the square wave electrical AC bias with the alternating display of two images creates a self-limiting reaction with an etch rate per pulse that is independent of many of the process variables. The achieved etch rate is independent of the KOH concentration (over the range tested: 0.25M-8M), the pulse amplitude (over the range tested: square waves where the applied voltage from the solution to the Si wafer varied from 0V for the off part of the pulse to 2-5V for the on part of the pulse), the duty cycle (over the tested range: 10%-90%) and the pulse frequency (over the tested range: 0.25-4 Hz).

With further reference to FIG. 1A, surface 12 of semiconductor substrate 13 may be imaged during the course of PEC etching by focusing an image of surface 12 onto a photodetector array 146 through beamsplitter 50. Real-time monitoring and closed-loop control of a semiconductor fabrication process are described below, with reference to FIG. 1B. In addition, the acquired images can be sent to processor 70 to compute the necessary translation and rotation of the pattern on the SLM 46 so that the illumination precisely aligns with wafer features such as cleavage planes or alignment marks.

Other processing steps may be used in conjunction with techniques particularly described herein, including, without limitation, such processes as dry etching, chemical-mechanical planarization, polishing and backside grinding, epitaxial growth, regrowth, material deposition, coating, lithographic patterning, or material modification through UV exposure, ion implantation, plasma ashing, baking, annealing, oxidation and surface passivation. More particularly, semiconductor substrate 13 may be annealed in an oven in such a manner as to reduce the resistance of an Ohmic contact or to modify the barrier height of a Schottky barrier contact relative to absence of annealing. Annealing to reduce Ohmic resistance or to modify Schottky barrier height need not be further described herein in that such techniques are known in the art and are described, for example, in Sheu et al., "*Effects of thermal annealing on the indium tin oxide Schottky contacts of n-GaN*," Appl. Phys. Lett., vol. 72, 3317 (1998), which is incorporated herein by reference.

Application of electrical potentials in a PEC etch process typically serves three objectives: it can modulate (either increase or suppress) the etching rate; it can reduce carrier diffusion and thereby improve the sidewall angle (anisotropic etching); and it can reduce carrier diffusion and thereby improve lateral resolution of etched patterns. The effect of lateral carrier diffusion on etching can be minimized in two ways: In the first approach, carrier diffusion length may be reduced by using semiconductor materials with very short carrier lifetimes, by virtue, for example, of being highly doped or grown at low temperature. Although a wide variety of high quality devices can be made with these materials, a more general approach that can work for any semiconductor is highly advantageous and is now described.

In accordance with an embodiment of the present invention, electrical potential is supplied in such a manner as to provide time gated etching. Unlike a projector, used as source 40, which is quasi—continuous wave (CW) (120 Hz), an SCL is a short-pulse laser source (with a 150-ps pulse width and a 3-MHz repetition rate typifying current operating characteristics). As the term is used herein, "quasi-CW" (or, synonymously, "quasi-continuous") shall refer to a flux, such as of light or of charge carriers, which has a modulated component characterized by a frequency not exceeding 200 Hz. The term "short-pulse" shall be used to characterize any source of illumination capable of generating pulses shorter than 1 ns. The term "AC" shall characterize any phenomenon that is not substantially constant as a function of time.

As now described with reference to FIGS. 2A-2F, an AC electrode bias 210 (shown in FIG. 2C) may be applied across electrodes 18 and 20 by electrical pulse generator 60 (shown in FIG. 1A) to drive the reactive ions in the etchant 14 and the carriers in the semiconductor 13 towards, or away from, each other. Although the two species (namely, the reactive ions in the etchant and the carriers in the semiconductor) barely move in the relatively short time interval 212 during which an electrical pulse is applied, the reactant surface density 230 (plotted versus time in FIG. 2E) may be significantly modulated at the interface between surface 12 and etchant 14, thereby greatly affect the etching rate. A "significant" modulation, for purposes of the present description, shall refer to modulation of the mean reactant surface density $\rho_0$ by at least 25%.

A precision delay generator 62 (shown in FIG. 1A) is used to trigger the timing of the electrode bias relative to the arrival of the SCL pulse 200 (shown in FIG. 2A). As shown in FIG. 2F, etch rate 260 is enhanced relative to the unbiased case during a time gated window 262 that is shorter than the recombination lifetime 220 (shown in the plot of FIG. 2B) and to inhibit the etch rate at all other times, i.e., when the carriers are diffusing laterally.

In accordance with other embodiments of the present invention, a DC bias may also be applied across electrodes 18 and 20 to drive the generated carriers to the surface, where they can be captured in surface trap states thereby inhibiting their lateral diffusion.

Figure 3:
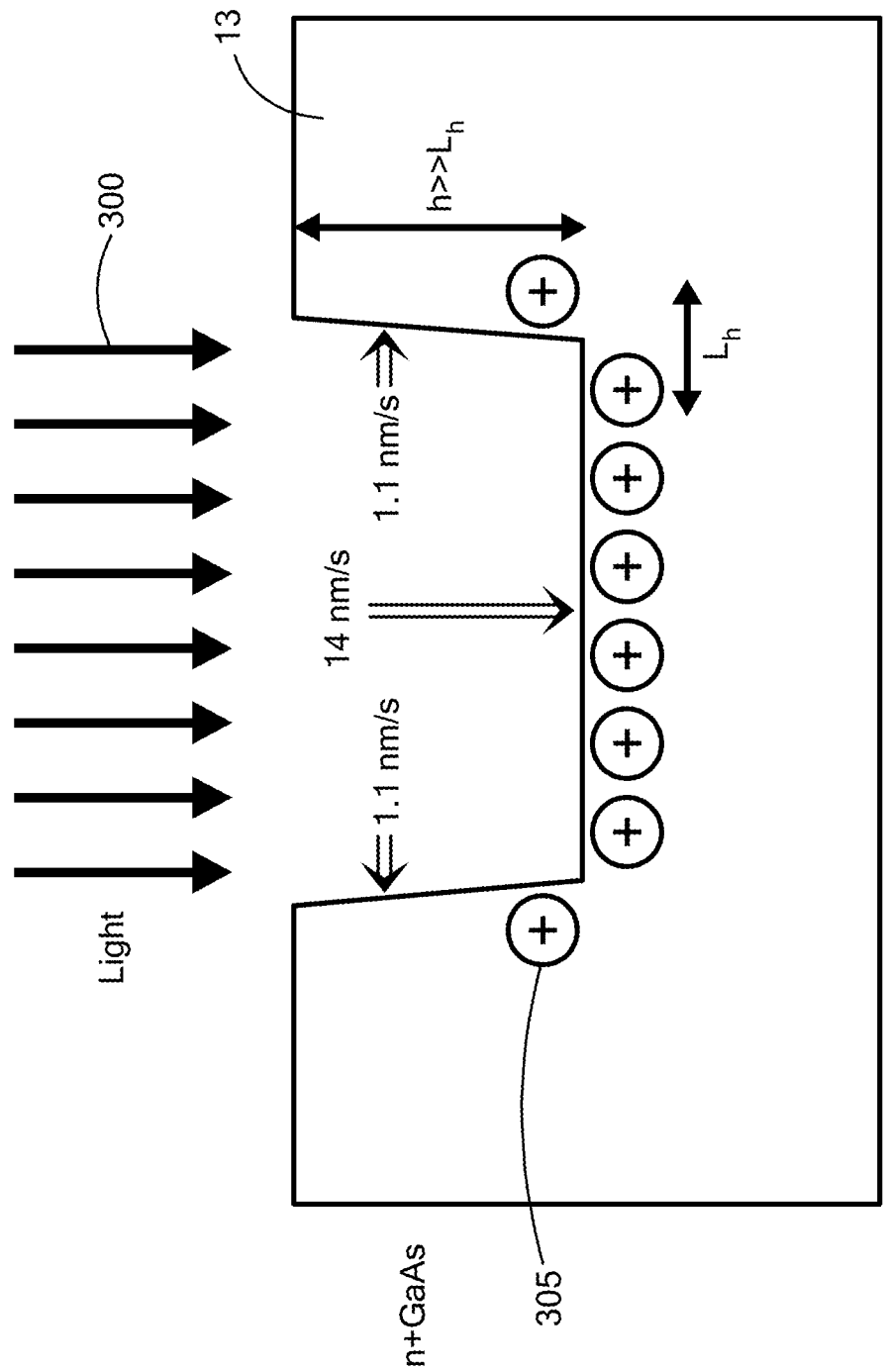
FIG. 3 illustrates the occurrence of anisotropic photochemical wet etching under conditions in which the etch depth exceeds the carrier diffusion length, in accordance with an embodiment of the present invention.

Referring now to FIG. 3, methods in accordance with the present invention may serve to provide an anisotropic wet etch, a critical barrier, in various cases, to making useful devices. Anisotropic wet etching requires increased light-induced vertical etch rate while minimizing the lateral etch rate into non-illuminated regions. The etch rate for n-type GaAs in 1:1:50 $H_3PO_4$:$H_2O_2$:$H_2O$ etch solution with Blue 255 on the projector (60 mW/cm$^2$ intensity in the sample plane) is 14 nm/s whereas the dark etch rate is 1.1 nm/s. When the etch depth h exceeds the diffusion length $L_n$, the sidewall angle may be expected to reach $\tan^{-1}(14/1.1)$ =85.5°. Anisotropy may be enhanced, in accordance with embodiments of the present invention, by: (1) minimizing the effect of carrier diffusion using time gated etching discussed previously, (2) using the SCL to deliver higher intensity and increase the light etch rate, and (3) maximizing the photo-induced etch selectivity (i.e. the ratio of etch rates with light to etch rates without light) on the basis of optimized etching chemical recipes, e.g. phosphoric acid, citric acid or HCl as the acid, $KMnO_4$ as the oxidizer or the use of no oxidizer, and water. In particular, the recipe of 1:50 HCl:$H_2O$ has been shown to have nearly infinite photo-induced selectivity and thus may be used to improve the etch anisotropy.

Two modalities that are encompassed within the scope of the present invention include 1) synchronizing the temporal profile of the electrical signal 210 (optimizing pulse delay, pulse duration, and pulse shape, e.g. square wave, triangular, sinusoidal, etc.) with respect to illumination pulse 200, as described above; and 2) providing a continuous (or quasi-continuous) illumination while pulsing the electrical bias signal.

Two further modalities within the scope of the present invention include 1) continuous-wave CW illumination and concurrent high frequency electrical pulsing; and 2) pulsed illumination in the presence of concurrent low-frequency pulsing for improved control of chemical reactions. "High-frequency," as the term is used herein, refers to frequencies in the 100 kHz-1 GHz range. "Low-frequency," as the term is used herein, refers to frequencies in the 0.001 Hz-1000 Hz range.

In accordance with an embodiment of the present invention, pulsing at low frequencies may be employed advantageously to achieve a single atomic layer of etching per pulse and therefore extremely accurate control of the etch depth.

When the spectrum and the duration of optical pulses, and the frequency and duration of electrical pulses are tailored in a PEC process, in accordance with the present teachings, the process and system may be referred to herein as "spectrally and temporally engineered processing using photoelectrochemistry," or otherwise as "STEP-PEC."

Real-Time Monitoring of Fabrication Process

Figure 1B:
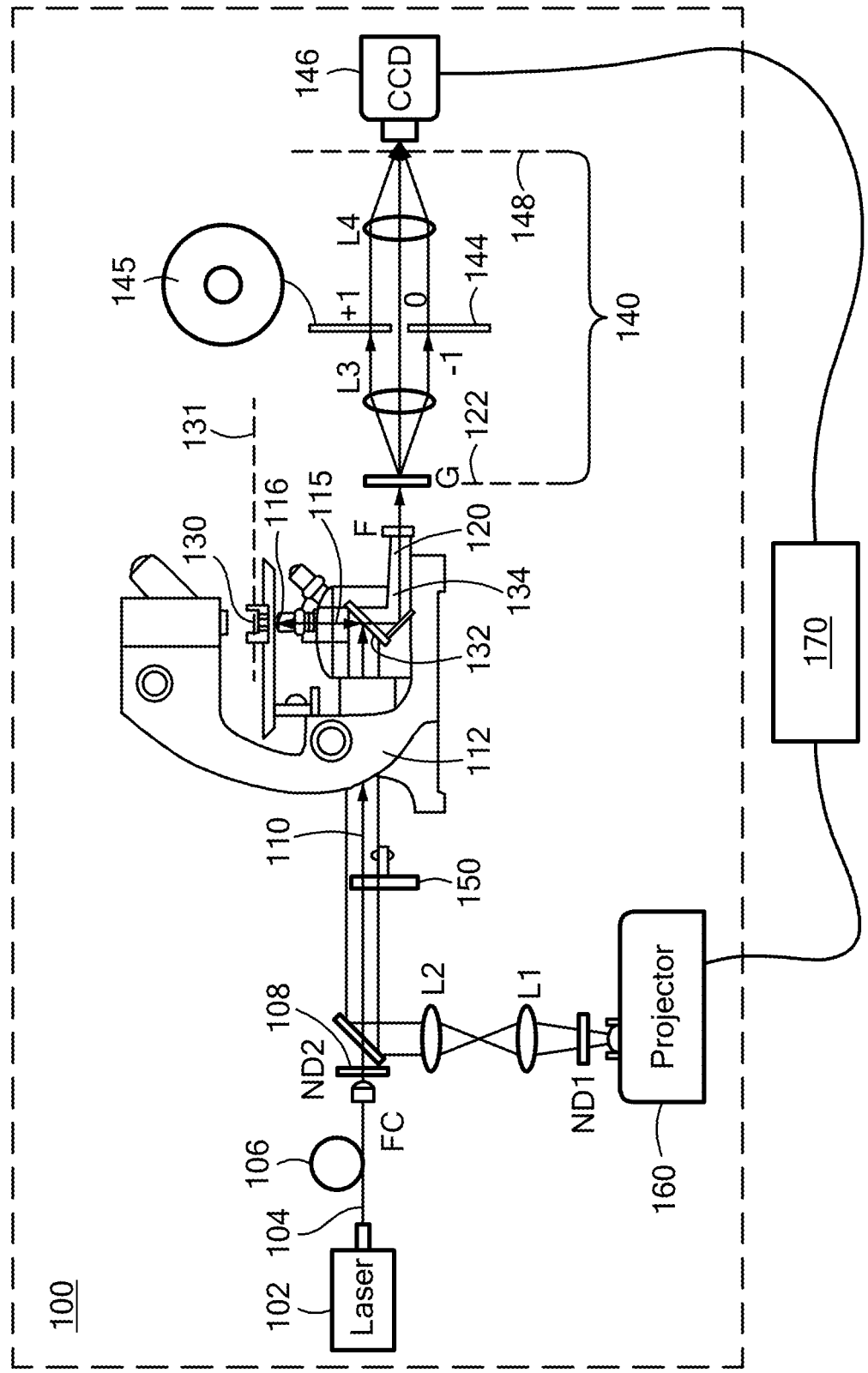
FIG. 1B shows a schematic layout of an epi-diffraction phase microscope in accordance with another embodiment of the present invention.

An apparatus for monitoring a semiconductor fabrication process, denoted an epi-diffraction phase microscope, and designated generally by numeral 100, is now described with reference to FIG. 1B. As shown in FIG. 1B, light 104 is provided by epi-illumination source 102, such as a frequency-doubled Nd:YAG laser emitting light at 532 nm. The emitted light 104 (a laser beam, in the embodiment depicted) is coupled into a single mode fiber 106, and then collimated, which ensures substantial spatial coherence of the output field (otherwise referred to as collimated light) 108. Other means for achieving a substantially spatially coherent illumination are within the scope of the present invention. Collimated light 108, via fiber coupler FC and neutral density filter ND2, then enters a back port 110 of an inverted microscope 112 and is imaged at a sample plane 118 after passing through an objective lens 116. Thus, light 120 is again a collimated beam after the objective 116, and may be filtered by filter F to select light at the wavelength of substantially spatial coherent source 102. Light 115 reflected or scattered from a sample 130 of interest is collected through the same objective 116, and directed via a beam splitter 132 toward a side output port 134 of the microscope. In preferred embodiments of the invention, sample 130 is a scattering surface characterized by a height profile relative to a fiducial plane. (A "fiducial plane" refers to any plane chosen as a reference plane with respect to which heights on the sample are referenced, for example, a plane of a substrate, such as a semiconductor wafer.) More particularly, sample 130 may be a semiconductor wafer undergoing processing, such as etching, and, more particularly, chemical etching. The semiconductor may be undergoing any other processing, as well, including, without limitation, such processes as dry etching, chemical-mechanical planarization, polishing and backside grinding, epitaxial growth, regrowth, material deposition, coating, lithographic patterning, or material modification through UV exposure, ion implantation, plasma ashing, baking, annealing, oxidation and surface passivation.

Within the scope of the present invention, the scattering surface associated with sample 130 may be any interface giving rise to a discontinuity in refractive index across the interface. Thus, in the context of semiconductor processing, the interface may be between the solid semiconductor and a tenuous medium such as a partial vacuum in which the semiconductor is processed.

In other embodiments of the invention, the interface constituting sample 130 may be an interface between a solid and a liquid or between a liquid and a gas or between a solid and a gas or between a plasma and a solid or between a plasma and a liquid or between a plasma and a gas, for example.

In order to quantify the phase shift distribution across the field of view with high stability, a compact Mach-Zehnder interferometer, designated generally by numeral 140 is comprised of the following salient components. A diffraction grating G is disposed at an image plane 122 of the microscope 112 such that multiple copies of an image of sample 130 are generated at different angles. It may be noted that a magnified replica is obtained, at image plane 122, of the field reflected by sample 130. In one embodiment of the present invention, diffraction grating G has 300 grooves/mm, blazed at an angle to maximize the power in the 1st diffraction order. Lens L3 is used to generate a Fourier transform of the image field at its back focal plane 144. At this Fourier plane 144, the 1st order beam is filtered down using a pinhole 145 (10-μm diameter, in the embodiment depicted), such that after passing through a second lens L4 this field approaches a plane wave and, thus, can be used as the reference of interferometer 140. The original image is carried by the 0th order, which is combined with the reference field at the charge-coupled device (CCD) camera plane 148 and creates an interferogram that has the following irradiance distribution:

$$I(x,y)=I_1+I_0(x,y)+2\sqrt{I_1 I_0(x,y)}\cos[\beta x+\varphi(x,y)], \quad (1)$$

where $I_0$ is the irradiance of the 0th diffraction order, $I_1$ is the irradiance of the 1st diffraction order after passing the pinhole, $\beta$ is the spatial modulation frequency provided by the grating, and $\varphi$ is the phase of interest. The interferogram is converted to an electrical signal by a camera 146.

A rotating diffuser 150 may be inserted into the path of collimated light 108 in order to reduce speckle associated with the laser light, and thereby significantly reduce the spatial phase noise floor. Moreover, rotating diffuser 150 also dithers the image, reducing quantization error.

From the interferogram of Eq. (1), a quantitative phase image is obtained via a spatial Hilbert transform, as described in detail in Ikeda et al., *Hilbert phase microscopy for investigating fast dynamics in transparent systems*, Opt. Lett., vol. 30, pp. 1165-67 (2005), which is incorporated herein by reference. The phase is then unwrapped using Goldstein's branch cut algorithm, as described in Ghiglia et al., *Two-Dimensional Phase Unwrapping: Theory, Algorithms, and Software* (Wiley, 1998), incorporated herein by reference. The phase is then converted into a height image, based on the fact that the phase delay, on reflection, scales directly with distance to a fiducial plane.

Illumination of sample 130 by a coherent or incoherent source, such as projector 160 for purposes of photochemical etching enhancement, has been described above.

EXAMPLE I

Unprocessed Wafer

Figure 5A:
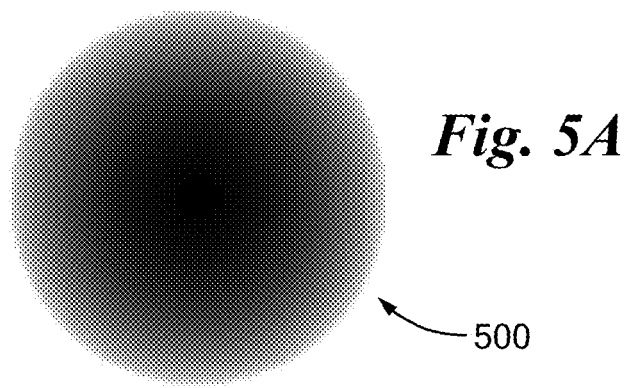
FIG. 5A shows a mask delivered by a projector to a sample plane for fabrication of a microlens, an epi-DPM image of which, in accordance with an embodiment of the present invention, in shown in FIG. 5B.
Figure 5B:
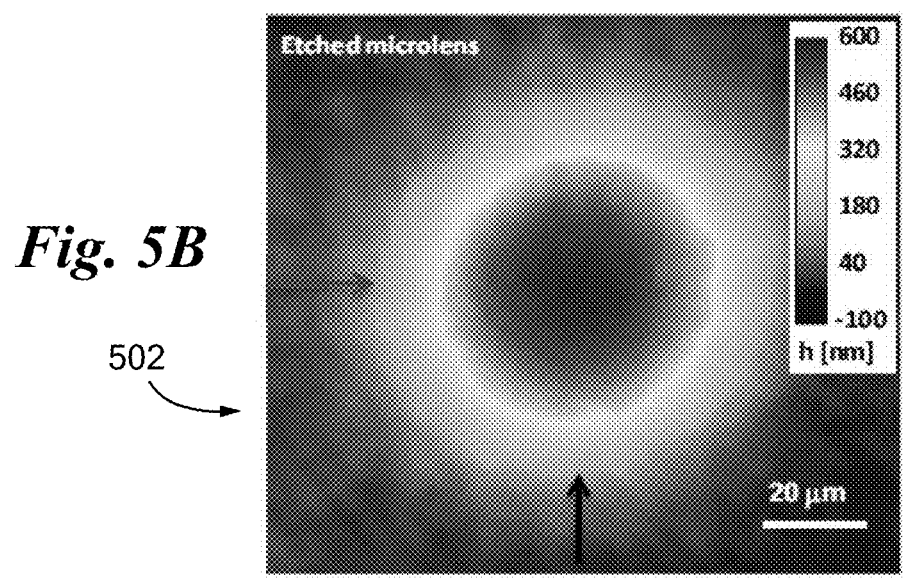
FIG. 5C shows height profiles of a 2×2 array of microlenses fabricated using techniques in accordance with embodiments of the present invention.

In accordance with embodiments of the present invention, epi-DPM may provide accurate topographic height maps relative to other points in the image and therefore may be advantageously made insensitive to any common mode motion of the sample. To characterize the spatial and temporal path length noise of the epi-DPM method described herein, a plain, unprocessed $n^+$ GaAs wafer (heavily n-doped) was imaged repeatedly in succession. The successive imaging yielded a time-lapse series of images containing 256 frames at 8.93 frames/s. A 10× objective (NA=0.25) provided a lateral resolution of 1 μm with a field of view of approximately 160 μm×120 μm. After recovering the height images, a quadratic fit of each individual image was subtracted off. The linear portion of the fit corrects for the tilt of the sample and the angle of interference in camera plane 148 while the quadratic portion corrects for the quadratic phase front of the beam across the field of view. After correction, the spatial standard deviation of the image at each time frame, $\sigma_{xy}(t)$, was computed, yielding a median value of 11.2 nm. Insertion of rotating diffuser 150 into collimated beam 108, as described above, reduced the spatial noise floor to 10.4 nm. cl EXAMPLE II Photochemical Etching of Arrays of Microlenses As an example of photochemical etching capabilities, epi-DPM was used to image microlens structures fabricated by photochemical etching. Light produced by light projector 160 (EPSON Powerlite S5 EMP-S5, for example) in the illumination path, such that gray-scale or color images delivered by a computer can be mapped onto the sample, as shown in FIG. 1B. Individual microlenses were fabricated using a digital image as an optical mask, which may be implemented by a spatial light modulator (SLM), for example, in order for the mask to be programmable and amenable to modification in real time. FIG. 5A shows a pattern of specified intensity distribution (otherwise referred to as mask 500) delivered by projector 160 to sample plane 131 (shown in FIG. 1B), while FIG. 5B is the corresponding epi-DPM image of the resulting fabricated microlens. Projector 160 may also deliver a pattern of both specified intensity distribution and specified color distribution. The samples were plain, unprocessed n+ GaAs wafers and the etch time was calibrated to 2 minutes for a lens height of 500 nm and a diameter of 100 µm. The measured height and diameter for the resulting microlens depicted in FIG. 5B were 590 nm and 100 µm, respectively. Both the projector and the imaging laser etch the sample. The laser etches uniformly while the projector etches the pattern. The laser power was minimized to reduce unwanted etching. At sample plane 131, the laser power density was 0.64 mW/cm$^2$ while the projector delivered 8.9 mW/cm$^2$. The power density of the laser under normal imaging conditions without attenuation was 57 mW/cm$^2$.

While profiles through the mask and the microlens indicate that the photochemical etching process is a nonlinear function of light irradiance delivered to a particular site, epi-DPM can measure precisely this nonlinear relationship and, in turn, provide a calibration curve for etching structures with prescribed profiles. In addition, imaging with epi-DPM can render the feedback necessary to fine-tune the etching process in real time, by controlling the projector light intensity across the field of view. Moreover, the use of color images on the projector can achieve selective or non-selective etching of materials with different bandgaps. For example, red light from the projector of wavelength 700 nm will create minority carriers in GaAs but not in $Al_xGa_{1-x}As$ for x>0.3 nor in $In_{0.49}Ga_{0.51}P$, thereby enabling selective etching of GaAs relative to $Al_xGa_{1-x}As$ and to $In_{0.49}Ga_{0.51}P$, whereas blue light of wavelength 450 nm will create minority carriers in GaAs, in $Al_xGa_{1-x}As$ for any composition x, and in $In_{0.49}Ga_{0.51}P$, enabling non-selective etching of the materials.

Figure 5C:
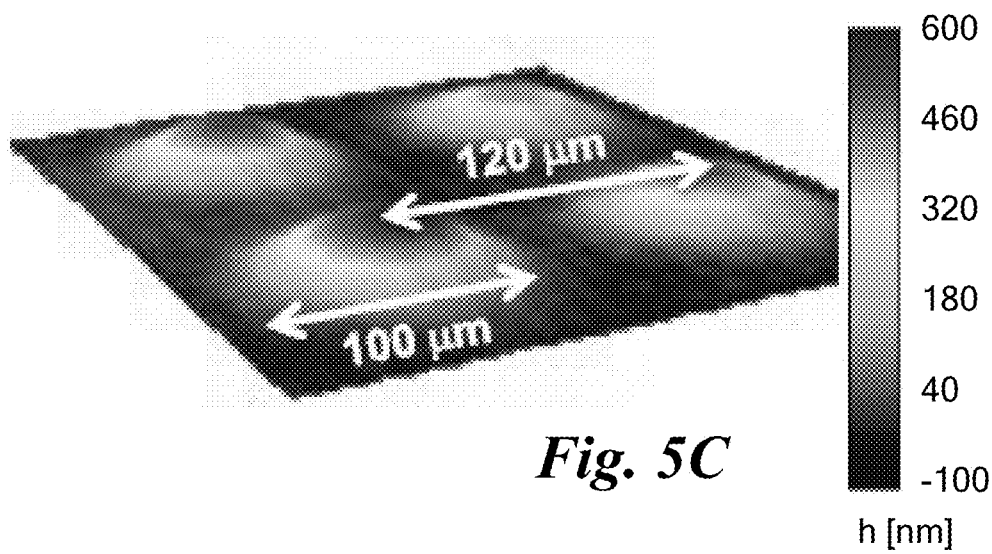

As a further illustration, 2×2 arrays of microlenses were fabricated, and profiled by epi-DPM as shown in FIG. 5C. The optical mask 500 in this case contained five 2×2 arrays of gray-scale lenses with 100-µm diameters and 120-µm pitch. The resulting heights ranged from about 425 to 590 nm across the array, the diameters from 95 to 105 µm, and the pitch from 120 to 125 µm. Better height uniformity across the array may be advantageously achieved by adaptive control in a feedback loop, using controller 170 to govern the mask pattern 500 projected by projector 160 in order to achieve a specified height profile on the semiconductor surface.

Electroplating/Doping

Conventional electroplating works by using electrical current to reduce dissolved metal cations so that they form a metal coating on a semiconductor, for example. In accordance with an embodiment of the present invention, the concept of selectively patterning metal by using the generated photocurrent is presented for the first time. The process is expected to be self-limiting, thereby allowing a repeatable deposition of metal contacts with a precise layer thickness. This is because as the metal deposits, it will begin to reflect the light and thus limit light absorption in the semiconductor underneath. Since the extinction coefficient of the metal is wavelength dependent, the thickness of the metal deposit may be controlled by engineering the spectrum. The self-limiting nature of the metallization may advantageously allow for the fabrication of highly reflective surfaces (optically opaque) at a given wavelength, or, alternatively, for tailoring a specified reflection spectrum while consuming the minimum amount of material.

Figure 6A:
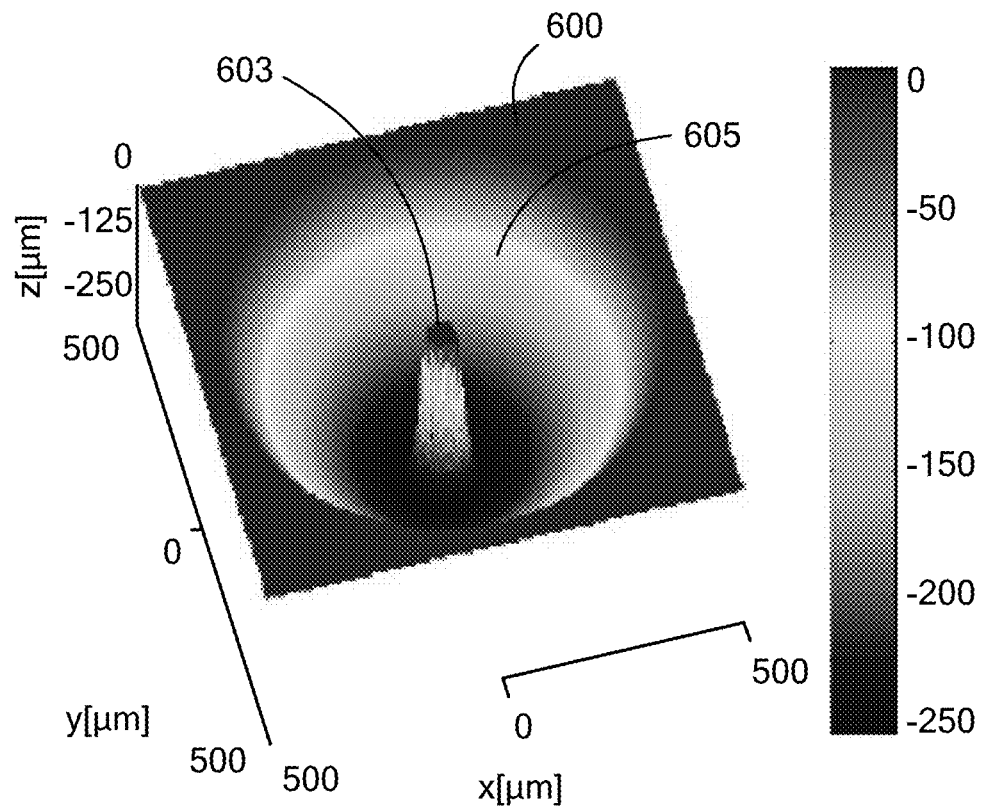
FIG. 6A is a contour map of a photodetector integrated with a parabolic reflector, such as may be fabricated in accordance with embodiments of the present invention.

A multi-process STEP-PEC system 10 may be advantageously employed to fabricate a detector 603 with an integral parabolic reflector 605, as now described with reference to FIG. 6A. A top-contact metal-semiconductor-metal (MSM) photodetector (PD) 603 is first photoelectroplated onto a silicon-on-insulator (SOI) wafer 600 until the plating is self-limiting. The MSM-PD is at the origin, as shown. Next, a large area parabolic surface 605 (1 mm diameter, 250 µm deep, by way of non-limiting example) with a nearly vertical pedestal (under detector 605) at the center is fabricated using the PEC etching technique described above. Next, an electrically isolated metal layer is electroplated so as to cover the parabolic surface 605, but not the pedestal or its sidewalls. This allows for parabolic reflector 605 to focus incident light from above into the top of the MSM-PD pedestal. Thus, a fast PD 605 with a very large collection area can be easily fabricated in a single system. Further, unlike conventional approaches that use off-chip lenses, the photodetector described herein has a lithographically defined light concentrator and thus needs no optical alignment during assembly.

Figure 9A:
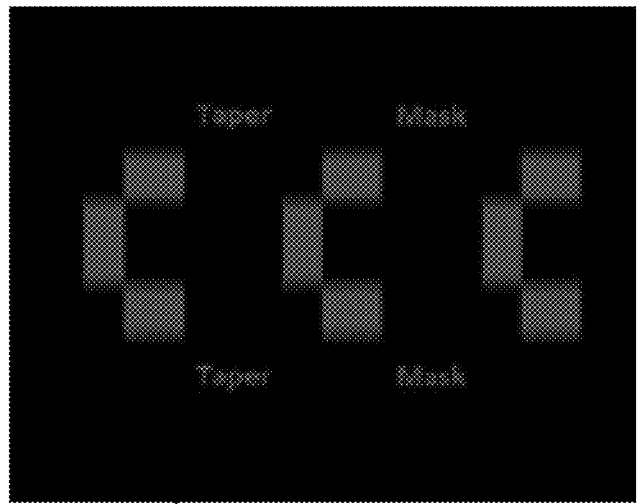
FIG. 9A depicts an image projected onto a substrate for creation of taper structures.
Figure 9B:
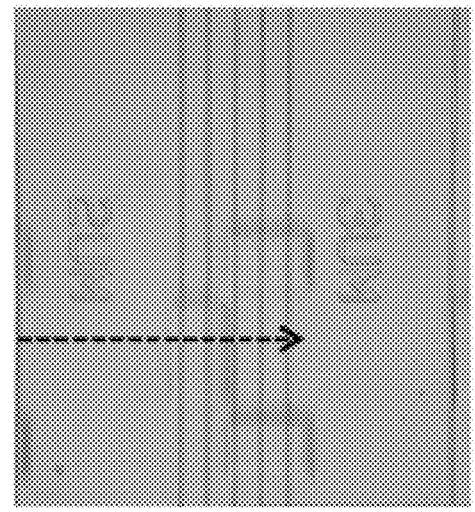
FIG. 9B is a microscope camera image during a profilometer scan of a vertically tapered waveguide structure fabricated in accordance with an embodiment of the present invention and FIG. 9C plots a profile of the same structure.
Figure 9C:
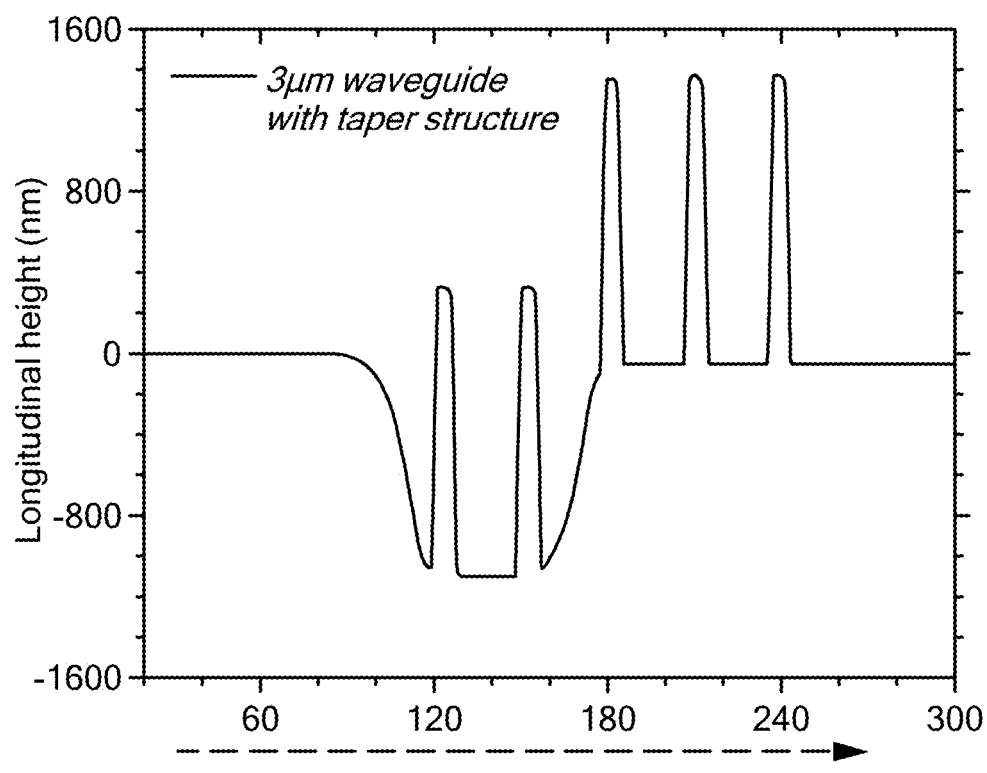
FIGS. 9D, 9E and 9F are perspective scanning electron microscope (SEM) views of the same taper structure.

In accordance with embodiments of the present invention, tapered waveguide structures, including adiabatically tapered waveguide structures as defined above, may be fabricated, as now described with reference to FIGS. 9A-9F. A projected image 910 for photochemical etching is shown in FIG. 9A. FIG. 9B shows a microscope camera image during a profilometer scan of a tapered structure 920 fabricated in accordance with an embodiment of the present invention, and FIG. 9C shows a cross-sectional plot of the height of the waveguides 920 along the dotted line in FIG. 9B as a function of horizontal position. The taper is perpendicular to this dotted line. The two waveguides on the left of FIG. 9C are at the bottom of a tapered rectangular region. For this cross section, light propagates in a lower plane in the two waveguides on the left compared to the other three waveguides on the right. Further along the direction of light propagation, the two left waveguides are at the top while the three right waveguides are at the bottom of a different tapered rectangular region. Thus, STEP-PEC can be used to create adiabatic tapers that guide light between waveguides located at different planes. This is important for creating a photonic integrated circuit because it enables one to couple light from an active section to a passive section that are defined on different planes. FIGS. 9D-9F show SEM images of taper structures 920 disposed adjacent to a 3-µm waveguide 930.

Figure 6B:
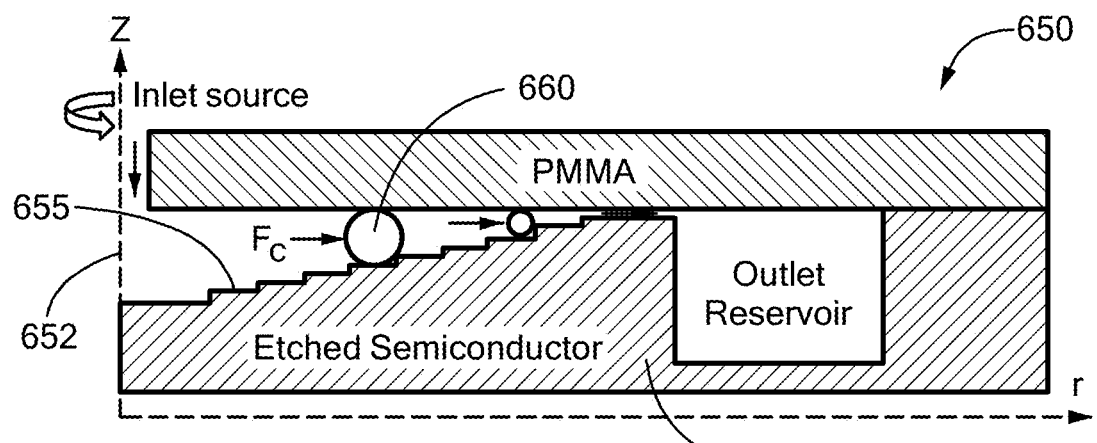
FIG. 6B is a cross-sectional view of a cell size sorting chip, such as may be fabricated in accordance with embodiments of the present invention.

Kindred technology, in accordance with embodiments of the present invention, may be used for other applications such as the fabrication of a covered-channel microfluidic device, designated generally by numeral 650, now described with reference to FIG. 6B. Microfluidic device 650, fabricated in accordance with PEC etch methods described above, may advantageously sort cells according to their size. Centrifugation of a covered channel microfluidic device 650 can sort cells if it has a series of discrete steps 655 ranging in height (e.g., etched height decreasing from 20 µm to 500-nm with 500-nm increments) as the radius is increased (e.g., from 0 to 1 cm). Fabrication of such a large area device with such precise vertical dimensions is extremely difficult using other techniques. Etched semiconductor 651 is spun about axis 652, and cells 660, suspended in a fluid, are driven (with centrifugal force $F_c$) between etched semiconductor 651 and covering platen 662, which may be PMMA, for example.

Cells may also be guided through a linear channel, designated generally by numeral 1010, and now described with reference to FIGS. 10A-10C. A series of discrete height steps 655 are etched into a semiconductor substrate 13 in accordance with the teachings above, by projection of an illumination pattern sequence depicted in FIG. 10B. Each image was projected for 3 minutes. The etch rate was 4.4 nm/s and thus each step had a height of 800 nm. A microfluidic inlet tube 1012 and outlet tube 1014 may be attached to the linear channel 1010 to flow cells 660 suspended in a fluid through the linear channel. FIG. 10C is a plot of channel height vs. position along the linear channel. An image sequence similar to the one shown in FIG. 10B may also be used to define an adiabatic taper. To achieve a more continuously varying height profile instead of a staircase, the illumination area should change more slowly from frame to frame and the duration of each image should be significantly shortened. For example, a sequence of 440 images displaying a rectangle whose length decreases 1 pixel per frame that is played at the rate of 4.4 frames per second would result in a 440 nm tall taper that is a staircase with 1 nm steps. This step size is small enough for the taper to be considered adiabatic.

Figure 7A:
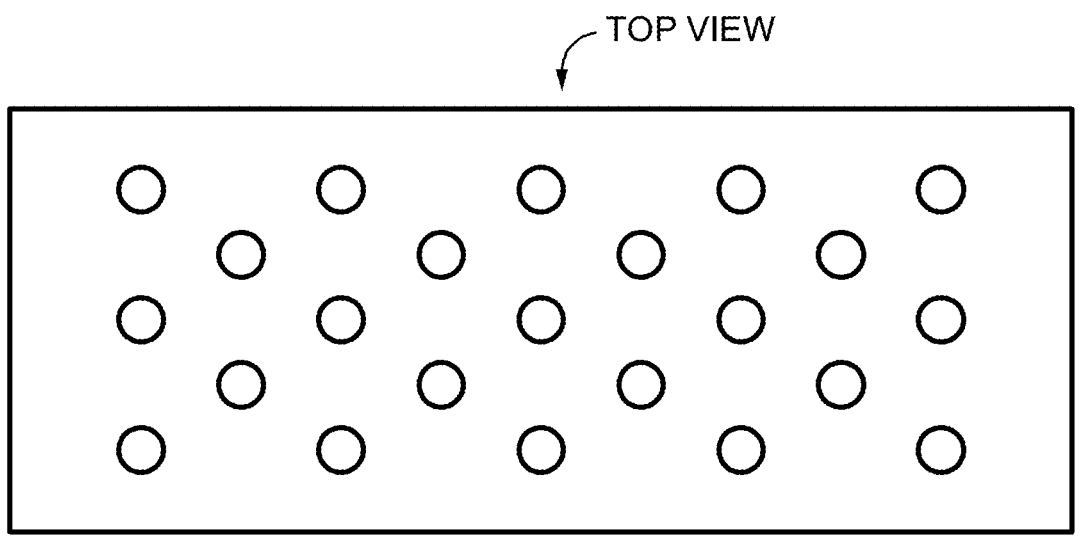
FIGS. 7A and 7B show top and cross-sectional views of a photonic bandgap chip, such as may be fabricated in accordance with embodiments of the present invention.
Figure 7B:
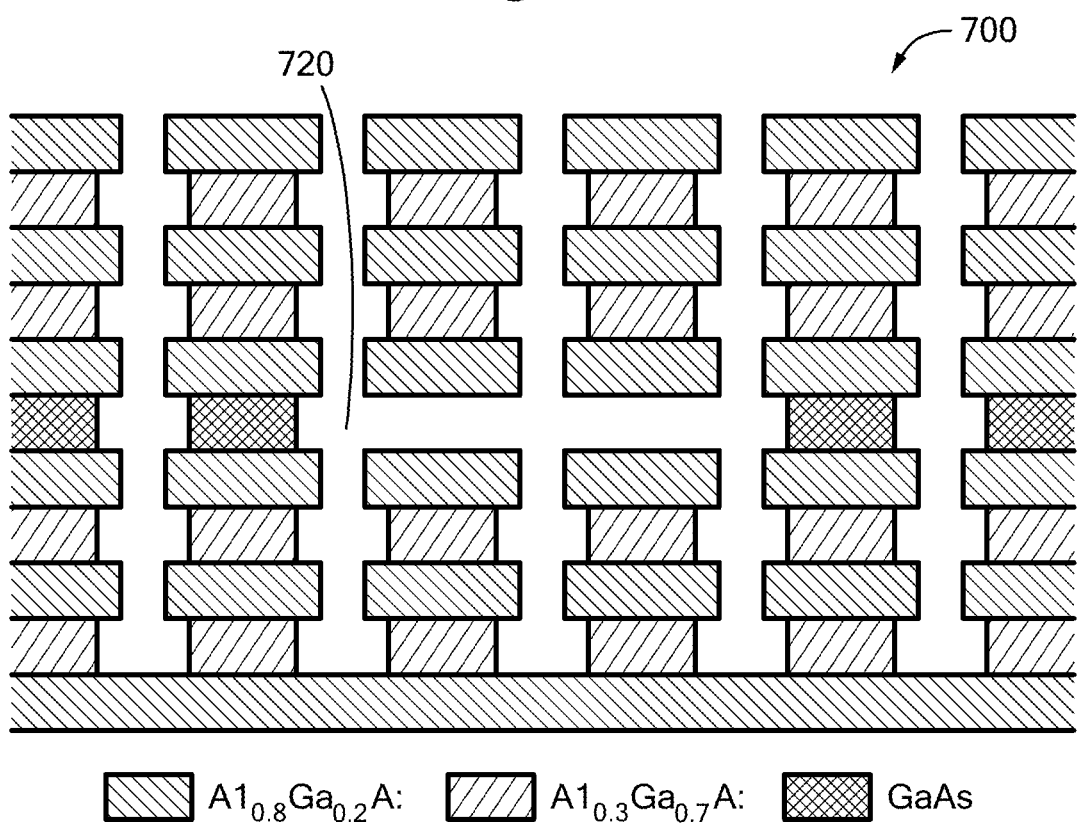

Insofar as STEP-PEC, as taught herein, etches only in layers in which light is absorbed, buried suspended membrane structures may advantageously be fabricated, as now described with reference to FIGS. 7A and 7B. Known techniques for producing suspended structures typically require a special sacrificial layer underneath the membrane to release devices, such as suspended photonic crystals (PhCs). Suspended PhC mirrors fabricated in that manner can be used for wavelength tuning by flexing the photonic crystal structure, thereby altering the photonic bandgap, as known in the art. In accordance with the present invention, a 3D photonic bandgap device with a defect cavity, designated generally by numeral 700 in FIG. 7B, may be fabricated as now described. FIG. 7A shows a top view, while FIG. 7B shows a cross section. A layered structure similar to that of a vertical cavity surface emitting laser (VCSEL) mirror is grown, with each layer 703 having thicknesses dependent on the desired periodicity of the PhC in the vertical direction. VCSEL fabrication techniques are described in Jewell et al., "*Vertical-Cavity Surface-Emitting Lasers: Design, Growth, Fabrication, Characterization,*" *IEEE JQE*, vol. 27, pp. 1132-46 (1991), which is incorporated herein by reference. Layers 703 alternate between a narrow bandgap (GaAs) or medium bandgap ($Al_{0.3}Ga_{0.7}As$) and a wide bandgap ($Al_{0.8}Ga_{0.2}As$) material. The light spectrum is long-pass filtered at 700 nm so that etching only occurs in the GaAs layer, or at 600 nm so that it occurs in both the GaAs and $Al_{0.3}Ga_{0.7}As$ layers. The fabrication process is as follows. First, a periodic array of holes is etched with STEP-PEC at 400 nm so that all layers are etched. Next, a uniform pattern of light at 600 nm is displayed which causes lateral etching in the exposed regions of the selected layers and thereby forms a PhC in the vertical direction. Finally, light filtered at 700 nm illuminates only through the center of the top surface. Since the AlGaAs layers are transparent, light is absorbed in the GaAs layer and causes etching of the defect cavity 720.

Fabrication of an integrated photonic-microfluidic circuit, designated generally by numeral 800, is now described with reference to FIGS. 8A-8E. Three applications are described: (1) a fully self-contained lab-on-a-chip that includes active laser sources, passive photonic components (e.g. waveguides, photodetectors, and other elements such as reflective micro-rings for single mode lasing), and microfluidic channels that allow the analyte to flow in direct contact with the waveguide core for enhanced sensitivity bio-sensing; (2) a photonic integrated circuit with embedded microfluidic cooling channels that spread out generated heat and thereby reduce thermal parasitics such as increased laser threshold, reduced efficiency, and resonance wavelength drift; and (3) fabrication of a diode pumped liquid gain medium laser. Many of the fabrication steps are the same for these three types of devices. To be able to form a microfluidic channel under the laser, the layer structure needs two additional layers (a sacrificial GaAs layer for the fluidic channel and an AlGaAs etch stop layer) at the base.

Figure 8A:
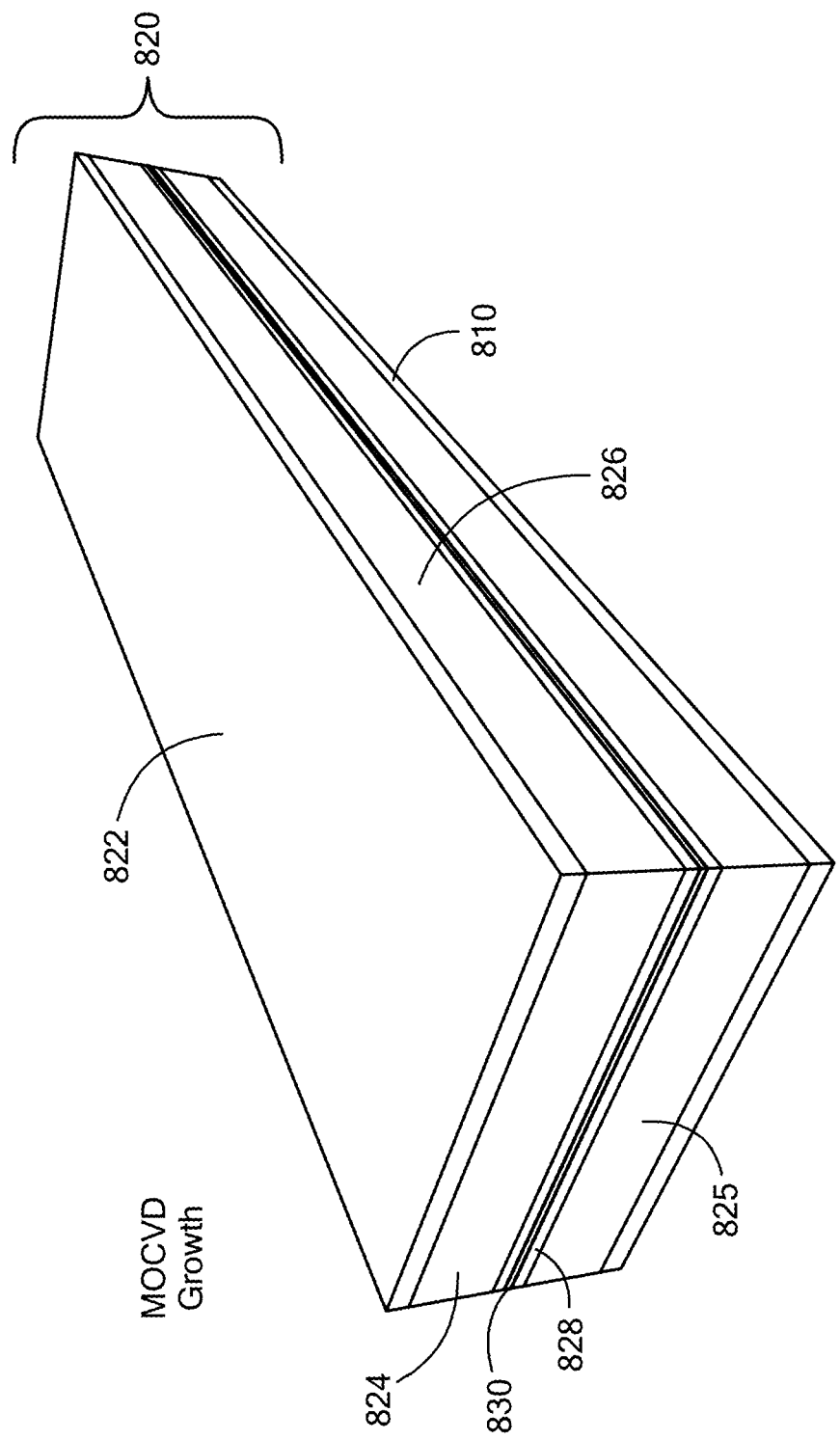
FIGS. 8A, 8B, 8C, 8D, and 8E show successive steps in the fabrication of an integrated photonics/microfluidics chip, such as may be fabricated in accordance with embodiments of the present invention.
Figure 8B:
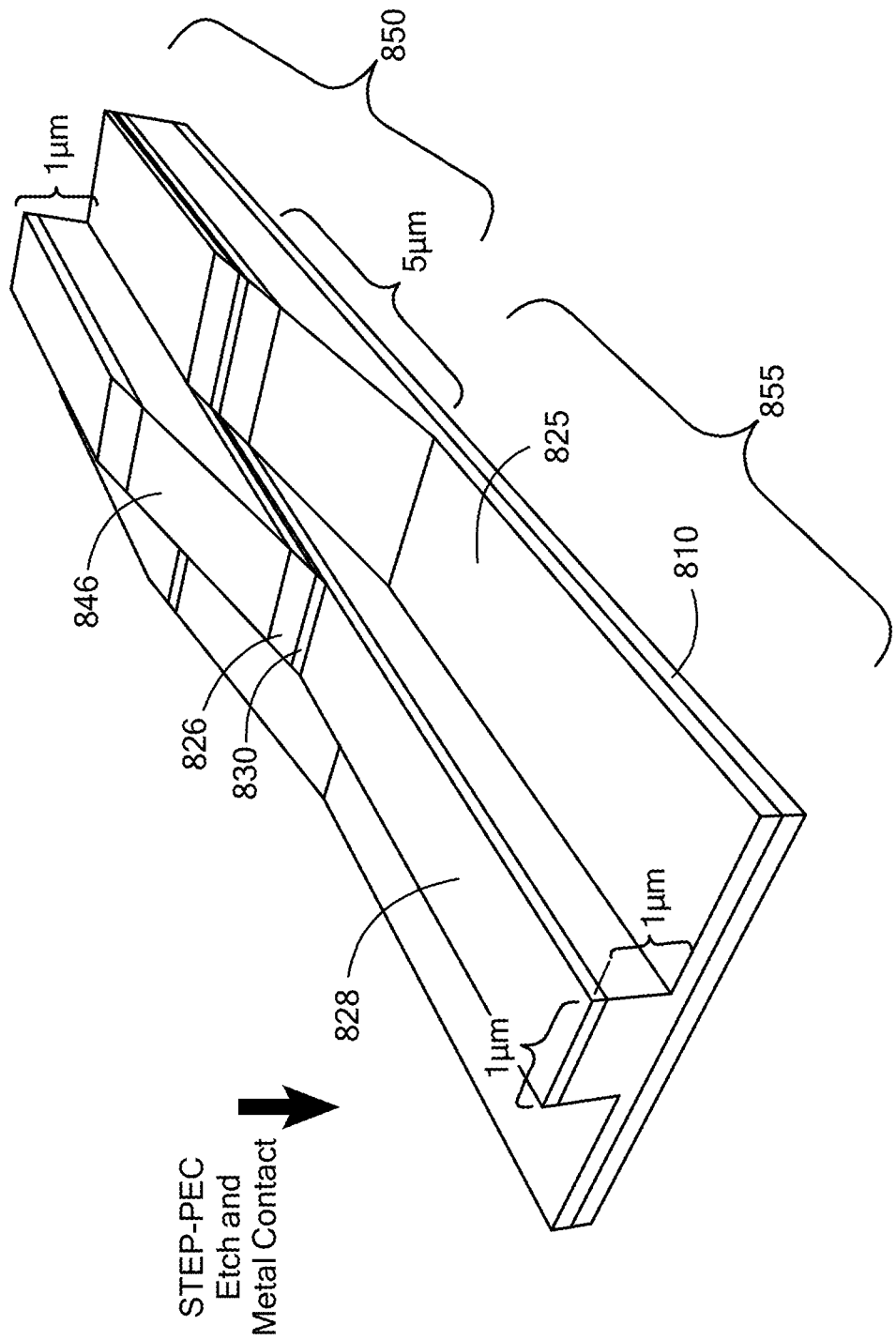
Figure 8C:
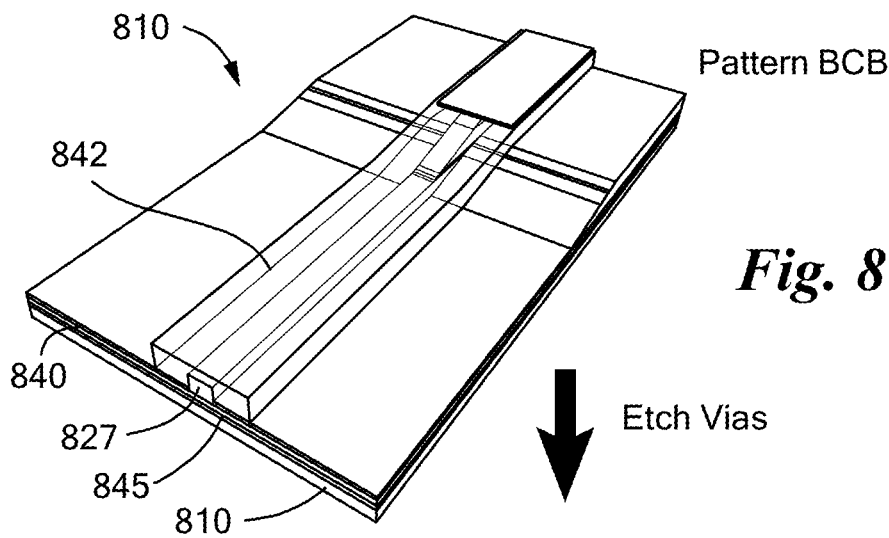

Processing starts with epitaxial layer growth, such as metal organic chemical vapor deposition (MOCVD) growth by way of non-limiting example, shown in FIG. 8A. MOCVD is used to grow epitaxial layers 820 of an edge emitting laser, such as a graded index separate confinement heterostructure (GRINSCH) 820 that may have layers that include:

- a highly doped GaAs top contact layer 822;
- a set of AlGaAs layers 824 of continuously (or substantially continuously) varying composition to form the graded index top cladding;
- the top half of an AlGaAs waveguide core 826;
- one or more InGaAs quantum wells to form the active gain region 830;
- the bottom half of an AlGAs waveguide core 828;
- an optional set of AlGaAs layers 825 of continuously varying composition to form the graded index bottom cladding;
- a sacrificial GaAs microfluidic channel layer 840 (shown in FIG. 8c); and
- an AlGaAs etch stop layer 845 on a GaAs substrate 810 (shown in FIG. 8c).

In a next step, described with reference to FIG. 8B, the quantum wells 830 and the top half of the AlGaAs waveguide core layer 826 are etched away to form a passive section 855 and STEP-PEC is used to create an adiabatic vertical taper 846 of the waveguide 827 to guide the light with low loss from the full waveguide core of the active section 850 to the bottom half waveguide core 828 of the passive section 855. An AlGaAs bottom half core layer 828 serves as the core for the passive section with benzocyclobutene (BCB) as its top cladding 842 (shown in FIG. 8C) and either the fluidic channel as its bottom cladding 870 (shown in FIG. 8E) in the bio-sensing application or the optional set of AlGaAs layers 825 is included and serves as its bottom cladding (shown in FIGS. 8A and 8B but not shown in FIG. 8C-8E) with the fluidic channel underneath for embedded cooling applications. Top cladding 842 may be referred to herein, without loss of generality, as "BCB" 842.

Figure 8D:
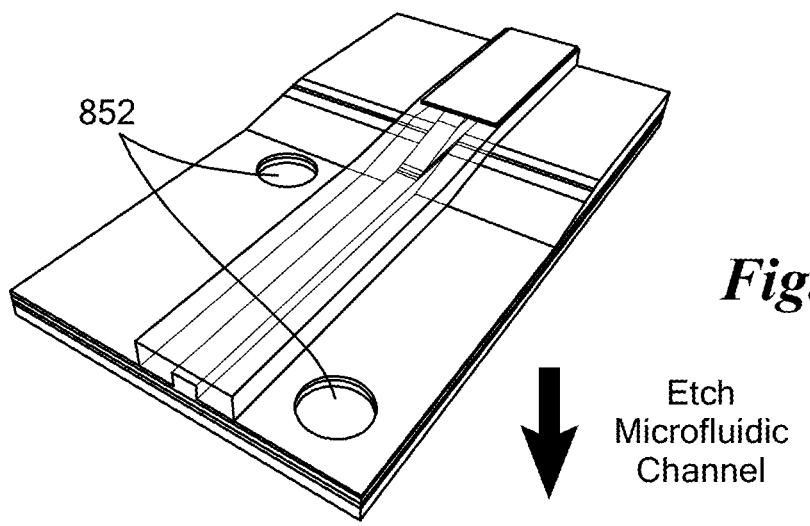

After the initial processing, the BCB 842 is patterned and etched with conventional lithography and dry etching to form a strip covering the passive waveguide, as shown in FIG. 8C. Next, as shown in FIG. 8D, STEP-PEC is used to etch holes 852 into the exposed AlGaAs core layer and the GaAs sacrificial layer in the passive section to form vias

Figure 8E:
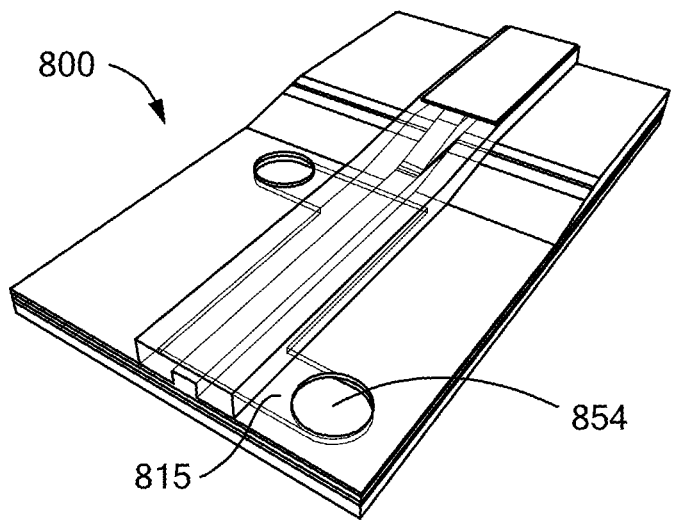

854. Then, as shown in FIG. 8E, STEP-PEC with the light filtered at 700 nm is projected into a narrow spot that starts at one hole and traces a path to the other hole. Since the AlGaAs core layer is transparent, light is only absorbed in the GaAs sacrificial layer so that etching only occurs in the GaAs layer along the illumination path. Finally, fluids for bio-sensing or for optical gain may flow through the fluidic channel 815 and the fluids will interact directly with light in the waveguide since the fluidic channel is the waveguide's lower cladding. Or, the optional graded index AlGaAs layers can sufficiently separate the fluidic channel from the waveguide to enable cooling without affecting the optical properties of the waveguide.

The foregoing processing steps may advantageously provide for the fabrication of one or more devices in the active section and/or for fabrication of one or more devices in the passive section of a chip.

In various embodiments of the present invention, disclosed steps of methods for STEP-PEC as well as for quantitative phase imaging of scattering surfaces characterized by a height profile relative to a fiducial plane may be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for fabricating a specified structure in a semiconductor substrate having a surface, the method comprising:
   a. applying an etch solution to the surface of the semiconductor substrate;
   b. generating a spatial pattern of electron-hole pairs by projecting a spatial pattern of illumination characterized by a specified intensity, a specified wavelength and a specified duration shorter than a carrier recombination lifetime, at each pixel of a plurality of pixels on the surface of the semiconductor substrate; and
   c. applying an electrical bias for driving reactive ions away from the surface of the semiconductor on a timescale shorter than the carrier recombination lifetime.

2. A method in accordance with claim 1, wherein applying an electrical bias comprises applying an electrical potential across the interface of the semiconductor and the etch solution, the electrical potential characterized by a specified temporal profile relative to the temporal profile of the spatial pattern of illumination.

3. A method in accordance with claim 1, wherein projecting the spatial pattern includes generating the illumination with a source selected from the group of sources including a projector, a supercontinuum laser, an optical parametric oscillator, a mode locked laser and a tunable laser.

4. A method in accordance with claim 1, wherein projecting the spatial pattern includes modulating at least one of a specified intensity and duration of illumination of each pixel with a spatial light modulator.

5. A method in accordance with claim 1, wherein projecting the spatial pattern includes displaying a sequence of two or more images.

6. A method in accordance with claim 1, wherein projecting the spatial pattern includes setting a gray scale intensity by means of pulse width modulation of a source.

7. A method in accordance with claim 1, wherein projecting the spatial pattern includes spectrally filtering the illumination within a path between a source of broadband light and the semiconductor substrate.

8. A method in accordance with claim 2, wherein applying an electrical potential across the interface between the semiconductor and the etch solution further includes controlling etch depth.

9. A method in accordance with claim 2, wherein applying an electrical potential across the etch solution further includes applying a DC bias potential.

10. A method in accordance with claim 1, wherein the etch solution comprises an acid and water.

11. A method in accordance with claim 10, wherein the etch solution additionally comprises an oxidizer.

12. A method in accordance with claim 1, wherein the etch solution comprises a base and water.

13. A method in accordance with claim 12, wherein the etch solution additionally comprises an oxidizer.

14. A method for fabricating a photonic integrated circuit, the method comprising:
   a. growing a layered stack of semiconductor materials;
   b. applying an etch solution to a surface of the layered stack of semiconductor materials;
   c. generating a spatial pattern of electron-hole pairs by projecting a spatial pattern of illumination characterized by a specified intensity, a specified wavelength and a specified duration shorter than a carrier recombination lifetime, at each pixel of a plurality of pixels on the surface;
   d. applying an electrical bias for driving reactive ions away from the surface of the semiconductor on a timescale shorter than the carrier recombination lifetime;
   e. creating an adiabatic taper between an active section and a passive section of the photonic integrated circuit by performing one of displaying a gradient pattern of light intensity or displaying a sequence of images to slowly vary the etch height; and f. defining a photonic device in at least one of the active and passive sections using at least one of photolithography, dry etching, deposition, and photoelectrochemical processing by illuminating with a pattern of light in such a manner as to cause etching, doping, or metallization.

15. A method in accordance with claim 14, further comprising:

a. planarizing the surface using a planarization polymer;

b. etching vias to allow chemical etchants to enter and exit; and c. etching a path connecting the entrance and exit vias to create a microfluidic channel.

16. A method for creating a spatially varying doping profile in a semiconductor substrate comprising:

applying an etch solution to the surface of the semiconductor substrate;

generating a spatial pattern of electron-hole pairs by projecting a spatial pattern of illumination characterized by a specified intensity, a specified wavelength and a specified duration shorter than a carrier recombination lifetime, at each pixel of a plurality of pixels on the surface of the semiconductor substrate;

applying an electrical bias for driving reactive ions away from the surface of the semiconductor on a timescale shorter than the carrier recombination lifetime; and applying an electrical potential to an electrode made of a dissolvable doping material relative to the semiconductor, wherein the semiconductor substrate and the dissolvable doping material are both suspended in a solution, in such a manner as to create a current of doping ions that attach to the surface of the semiconductor at locations determined by the generated electron-hole pairs.

17. A method according to claim 16, further comprising annealing the wafer in an oven in such a manner as to promote the diffusion of doping ions from the surface of the semiconductor into the bulk semiconductor.

18. A method according to claim 16, wherein the dissolvable doping material includes at least one of magnesium and zinc for a GaAs wafer.

19. A method according to claim 16, wherein the dissolvable doping material includes doping ions dissolved within the solution.

20. A method according to claim 16, wherein the dissolvable doping material includes metal ions dissolved within the solution.

21. A method for metallizing a semiconductor substrate having a surface, the method comprising:

applying an etch solution to the surface of the semiconductor substrate;

generating a spatial pattern of electron-hole pairs by projecting a spatial pattern of illumination characterized by a specified intensity, a specified wavelength and a specified duration shorter than a carrier recombination lifetime, at each pixel of a plurality of pixels on the surface of the semiconductor substrate;

applying an electrical bias for driving reactive ions away from the surface of the semiconductor on a timescale shorter than the carrier recombination lifetime; and applying an electrical potential to an electrode made of a dissolvable metal relative to the semiconductor, wherein the semiconductor substrate and the dissolvable metal are both suspended in a solution in such a manner as to create a current of metal ions that attach to the surface of the semiconductor at locations determined by the generated electron-hole pairs.

22. A method according to claim 21, further comprising annealing the semiconductor substrate in an oven in such a manner as to reduce the resistance of an Ohmic contact or to modify the barrier height of a Schottky barrier contact relative to absence of annealing.

23. A method according to claim 21, wherein the dissolvable metal includes one of gold and nickel.

* * * * *